(12) United States Patent
Wan et al.

(10) Patent No.: US 11,335,655 B2
(45) Date of Patent: May 17, 2022

(54) PACKAGE STRUCTURE AND MANUFACTURING METHOD THEREOF

(71) Applicant: Taiwan Semiconductor Manufacturing Company, Ltd., Hsinchu (TW)

(72) Inventors: Albert Wan, Hsinchu (TW); Chao-Wen Shih, Hsinchu County (TW); Shou-Zen Chang, Hsinchu (TW); Nan-Chin Chuang, Taipei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 17/120,287

(22) Filed: Dec. 14, 2020

(65) Prior Publication Data

US 2021/0098396 A1 Apr. 1, 2021

Related U.S. Application Data

(63) Continuation of application No. 16/661,972, filed on Oct. 23, 2019, now Pat. No. 10,867,940, which is a continuation of application No. 16/252,728, filed on Jan. 21, 2019, now Pat. No. 10,475,757, which is a continuation of application No. 15/652,249, filed on Jul. 18, 2017, now Pat. No. 10,186,492.

(51) Int. Cl.
*H01L 23/66* (2006.01)
*H01L 23/00* (2006.01)
(Continued)

(52) U.S. Cl.
CPC ............ *H01L 23/66* (2013.01); *H01L 21/565* (2013.01); *H01L 21/568* (2013.01);
(Continued)

(58) Field of Classification Search
CPC ..... H01L 23/66; H01L 21/565; H01L 21/568; H01L 21/6835; H01L 23/3135;
(Continued)

(56) References Cited

U.S. PATENT DOCUMENTS 9,000,584 B2 * 4/2015 Lin ..................... H01L 23/3114
257/737
9,048,222 B2 * 6/2015 Hung .................... H01L 23/481
(Continued)

FOREIGN PATENT DOCUMENTS

CN 103872012 6/2014
CN 106129020 11/2016
(Continued)

OTHER PUBLICATIONS

"Office Action of Taiwan Counterpart Application", dated Dec. 1, 2020, p. 1-p. 5.
(Continued)

*Primary Examiner* — Earl N Taylor
(74) *Attorney, Agent, or Firm* — JCIPRNET

(57) ABSTRACT

A package structure include a ground plate, a semiconductor die, a molding compound, and an antenna element. The semiconductor die is located over the ground plate. The molding compound is located over the semiconductor die. The antenna element is located in the molding compound and overlaps with the ground plate along a stacking direction of the ground plate, the semiconductor die and the molding compound. The antenna element has a first side levelled with a first surface of the molding compound, and the ground plate is located between the semiconductor die and the antenna element.

20 Claims, 15 Drawing Sheets

(51) Int. Cl.
*H01L 23/48* (2006.01)
*H01L 23/31* (2006.01)
*H01L 23/60* (2006.01)
*H01L 21/56* (2006.01)
*H01L 21/683* (2006.01)
*H01Q 1/22* (2006.01)
*H01Q 1/40* (2006.01)
*H01Q 9/30* (2006.01)
*H01L 21/66* (2006.01)

(52) U.S. Cl.
CPC ........ *H01L 21/6835* (2013.01); *H01L 23/315* (2013.01); *H01L 23/3135* (2013.01); *H01L 23/481* (2013.01); *H01L 23/60* (2013.01); *H01L 24/13* (2013.01); *H01L 24/19* (2013.01); *H01L 24/20* (2013.01); *H01Q 1/2283* (2013.01); *H01Q 1/40* (2013.01); *H01Q 9/30* (2013.01); *H01L 22/32* (2013.01); *H01L 24/11* (2013.01); *H01L 2221/68345* (2013.01); *H01L 2221/68359* (2013.01); *H01L 2223/6677* (2013.01); *H01L 2224/0401* (2013.01); *H01L 2224/04105* (2013.01); *H01L 2224/11002* (2013.01); *H01L 2224/12105* (2013.01); *H01L 2224/13023* (2013.01); *H01L 2224/13024* (2013.01); *H01L 2224/16227* (2013.01); *H01L 2224/211* (2013.01); *H01L 2224/32225* (2013.01); *H01L 2224/73267* (2013.01); *H01L 2224/81005* (2013.01); *H01L 2224/92244* (2013.01); *H01L 2924/141* (2013.01); *H01L 2924/143* (2013.01); *H01L 2924/1421* (2013.01); *H01L 2924/1431* (2013.01); *H01L 2924/1433* (2013.01); *H01L 2924/1434* (2013.01); *H01L 2924/15321* (2013.01)

(58) Field of Classification Search
CPC ..... H01L 23/315; H01L 23/481; H01L 23/60; H01L 24/13; H01L 24/19; H01L 24/20; H01L 22/32; H01L 24/11; H01L 2221/68345; H01L 2221/68359; H01L 2223/6677; H01L 2224/0401; H01L 2224/04105; H01L 2224/11002; H01L 2224/12105; H01L 2224/13023; H01L 2224/13024; H01L 2224/16227; H01L 2224/211; H01L 2224/32225; H01L 2224/73267; H01L 2224/81005; H01L 2224/92244; H01L 2924/141; H01L 2924/1421; H01L 2924/143; H01L 2924/1431; H01L 2924/1433; H01L 2924/1434; H01L 2924/15321; H01L 24/16; H01L 24/32; H01L 24/81; H01L 24/83; H01L 2224/13147; H01L 2224/18; H01L 2224/73204; H01L 2224/83005; H01L 23/3107; H01Q 1/2283; H01Q 1/40; H01Q 9/30; H01Q 1/38

See application file for complete search history.

(56) References Cited

U.S. PATENT DOCUMENTS

| | | | | |
|---|---|---|---|---|
| 9,048,233 | B2* | 6/2015 | Wu | H01L 25/0657 |
| 9,064,874 | B2* | 6/2015 | Edelstein | H01L 23/53209 |
| 9,064,879 | B2 | 6/2015 | Hung et al. | |
| 9,111,949 | B2* | 8/2015 | Yu | H01L 23/5389 |
| 9,263,511 | B2* | 2/2016 | Yu | H01L 21/565 |
| 9,281,254 | B2* | 3/2016 | Yu | H01L 24/09 |
| 9,362,234 | B2* | 6/2016 | Pabst | H01L 21/768 |
| 9,368,460 | B2* | 6/2016 | Yu | H01L 23/3192 |
| 9,372,206 | B2* | 6/2016 | Wu | G01R 31/2886 |
| 9,496,189 | B2* | 11/2016 | Yu | H01L 22/32 |
| 9,806,040 | B2* | 10/2017 | Liu | H01L 21/568 |
| 9,935,065 | B1* | 4/2018 | Baheti | H01L 23/49822 |
| 10,186,492 | B1* | 1/2019 | Wan | H01L 23/481 |
| 2006/0044188 | A1* | 3/2006 | Tsai | H01Q 9/0407 343/700 MS |
| 2006/0049995 | A1* | 3/2006 | Imaoka | H01Q 1/2283 343/702 |
| 2008/0291115 | A1* | 11/2008 | Doan | H01Q 21/0087 343/893 |
| 2010/0193935 | A1* | 8/2010 | Lachner | H01L 24/19 257/693 |
| 2012/0104574 | A1* | 5/2012 | Boeck | H01L 24/20 257/660 |
| 2013/0292808 | A1* | 11/2013 | Yen | H01L 23/5227 257/660 |
| 2014/0110841 | A1* | 4/2014 | Beer | H01L 23/49816 257/738 |
| 2014/0168014 | A1* | 6/2014 | Chih | H01L 21/56 343/700 MS |
| 2014/0184460 | A1* | 7/2014 | Yen | H01Q 13/106 343/770 |
| 2014/0198013 | A1* | 7/2014 | Saraswat | H01L 23/481 343/893 |
| 2015/0084194 | A1* | 3/2015 | Molzer | H01L 23/481 257/741 |
| 2015/0145108 | A1* | 5/2015 | Yap | H01L 24/96 257/664 |
| 2015/0194388 | A1* | 7/2015 | Pabst | H01L 23/3128 257/659 |
| 2016/0087333 | A1* | 3/2016 | Tong | H01Q 1/40 343/873 |
| 2016/0218072 | A1* | 7/2016 | Liao | H01L 23/49816 |
| 2016/0329299 | A1* | 11/2016 | Lin | H01L 23/3128 |
| 2017/0033062 | A1* | 2/2017 | Liu | H01L 21/486 |
| 2017/0110440 | A1* | 4/2017 | Jang | H01L 24/17 |
| 2017/0201023 | A1* | 7/2017 | Chiu | H01Q 9/065 |
| 2017/0236776 | A1* | 8/2017 | Huynh | H01Q 9/285 257/428 |
| 2017/0278808 | A1* | 9/2017 | Liao | H01Q 9/0407 |
| 2017/0317418 | A1* | 11/2017 | Garcia | H01L 23/66 |
| 2017/0344872 | A1* | 11/2017 | Komaki | H01L 21/56 |
| 2017/0346185 | A1* | 11/2017 | Wang | H01Q 9/065 |
| 2018/0012851 | A1* | 1/2018 | Liu | H01L 23/528 |
| 2018/0076526 | A1* | 3/2018 | Garcia | G06K 19/07749 |
| 2018/0269139 | A1* | 9/2018 | Chiang | H01L 23/5389 |
| 2018/0315715 | A1* | 11/2018 | Chiu | H01L 23/66 |
| 2018/0337149 | A1* | 11/2018 | Lin | H01L 21/6835 |
| 2019/0027449 | A1* | 1/2019 | Wan | H01L 21/565 |
| 2019/0157224 | A1* | 5/2019 | Wan | H01L 24/19 |
| 2020/0058607 | A1* | 2/2020 | Wan | H01L 23/60 |
| 2021/0098396 | A1* | 4/2021 | Wan | H01L 21/565 |

FOREIGN PATENT DOCUMENTS

| | | |
|---|---|---|
| TW | 201719833 | 6/2017 |
| TW | 201724386 | 7/2017 |
| TW | 201724416 | 7/2017 |

OTHER PUBLICATIONS

"Office Action of China Counterpart Application", dated Jun. 2, 2021, p. 1-p. 9.

* cited by examiner

PACKAGE STRUCTURE AND MANUFACTURING METHOD THEREOF

CROSS-REFERENCE TO RELATED APPLICATION

This application is a continuation application of and claims the priority benefit of a prior U.S. patent application Ser. No. 16/661,972, filed on Oct. 23, 2019. The prior U.S. patent application Ser. No. 16/661,972 is a continuation application of and claims the priority benefit of a prior U.S. patent application Ser. No. 16/252,728, filed on Jan. 21, 2019 and now U.S. Pat. No. 10,475,757. The prior U.S. patent application Ser. No. 16/252,728 is a continuation application of and claims the priority benefit of a U.S. patent application Ser. No. 15/652,249, filed on Jul. 18, 2017 and now U.S. Pat. No. 10,186,492. The entirety of each of the above-mentioned patent applications is hereby incorporated by reference herein and made a part of this specification.

BACKGROUND

Semiconductor devices and integrated circuits are typically manufactured on a single semiconductor wafer. The dies of the wafer may be processed and packaged with other semiconductor devices (e.g. antenna) or dies at the wafer level, and various technologies have been developed for the wafer level packaging.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
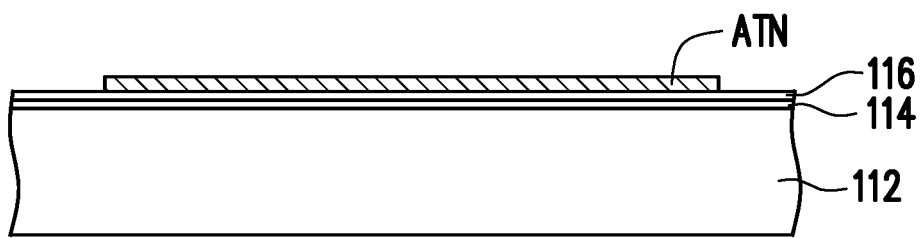
FIG. 1A to FIG. 1H are schematic cross sectional views of various stages in a manufacturing method of a package structure according to some exemplary embodiments of the present disclosure.

The following disclosure provides many different embodiments, or examples, for implementing different features of the provided subject matter. Specific examples of components, values, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In addition, terms, such as "first", "second", "third" and the like, may be used herein for ease of description to describe similar or different element(s) or feature(s) as illustrated in the figures, and may be used interchangeably depending on the order of the presence or the contexts of the description.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

Figure 6:
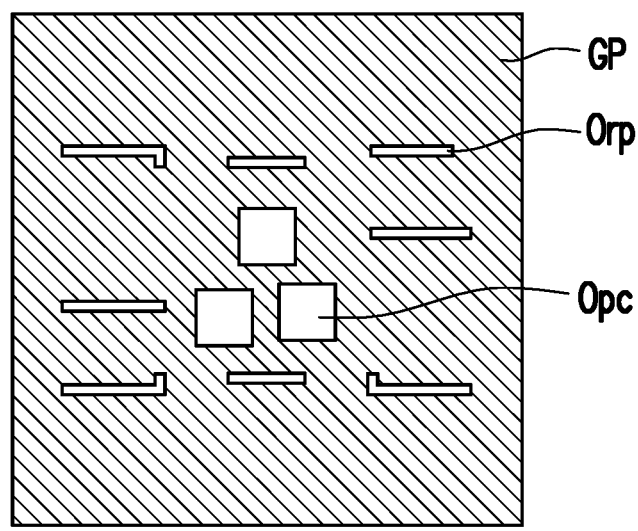
FIG. 6 is a schematic top view illustrating a ground plane portion according to some exemplary embodiments of the present disclosure.

FIG. 1A to FIG. 1H are schematic cross sectional views of various stages in a manufacturing method of a package structure according to some exemplary embodiments of the present disclosure. FIG. 6 is a schematic top view illustrating a ground plane portion of a redistribution layer in a package structure according to some exemplary embodiments of the present disclosure. In exemplary embodiments, the manufacturing method is part of a wafer level packaging process. In FIG. 1A to FIG. 1H, one die is shown to represent plural dies of the wafer, and a package structure 10 is shown to represent a package structure obtained following the manufacturing method, for example. In other embodiments, two chips or dies are shown to represent plural chips or dies of the wafer, and one or more package structures are shown to represent plural (semiconductor) package structures obtained following the (semiconductor) manufacturing method, the disclosure is not limited thereto.

Referring to FIG. 1A, in some embodiments, a carrier 112 is provided, and the carrier 112 may be a glass carrier or any suitable carrier for the manufacturing method of the package structure. In some embodiments, the carrier 112 is coated with a debond layer 114. The material of the debond layer 114 may be any material suitable for debonding the carrier 112 from the above layers disposed thereon. Next, a dielectric layer 116 is formed on the carrier 112 by forming a dielectric material layer (not shown) over the carrier 112. The dielectric layer 116 may be formed by a suitable fabrication technique such as spin-coating, lamination, deposition or the like. In some embodiments, the dielectric layer 116 is a polymer layer; the polymer layer may include polyimide, polybenzoxazole (PBO), benzocyclobutene (BCB), Ajinomoto Buildup Film (ABF), Solder Resist film (SR), or the like.

As shown in FIG. 1A, an antenna element ATN is formed on the carrier 112. In some embodiments, the antenna element ATN may be formed by forming a metallization material layer (not shown) over the carrier 112 and patterning the metallization material layer to form a patterned metallic layer (referred as the antenna element ATN). In some embodiments, the material of the antenna element ATN may include aluminum, titanium, copper, nickel, tungsten, and/or alloys thereof, the antenna element ATN may be formed by a suitable fabricating technique such as deposition or electroplating, and may be patterned by a suitable patterning process such as photolithography and etching.

Figure 1B:
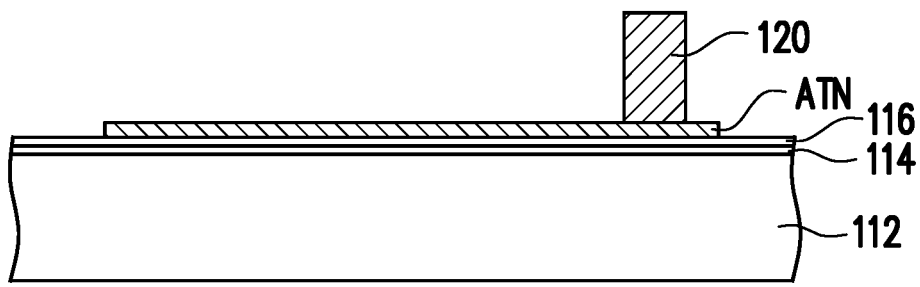

Referring to FIG. 1B, in some embodiments, at least one through interlayer via (TIV) 120 is formed on the carrier 112, and the TIV 120 is in contact with and electrically connected to the antenna element ATN. Only one TIV is shown here but the number of the TIV is not limited by the descriptions herein. In some embodiments, the TIV 120 is a through integrated fan-out (InFO) via. In certain embodiments, the TIV 120 is physically connected and arranged near an edge of the antenna element ATN. In some embodiments, the TIV 120 is formed by photolithography, plating, photoresist stripping processes or any other suitable method. In one embodiment, the TIV 120 may be formed by forming a mask pattern (not shown) with openings exposing a portion the antenna element ATN and forming a metallic material filling the openings to form the TIV 120 on the expose portion of the antenna element ATN by electroplating or deposition and then removing the mask pattern. However, the disclosure is not limited thereto. In one embodiment, the material of the TIV 120 may include a metal material such as copper or copper alloys, or the like. As shown in FIG. 1B, only one TIV 120 is shown; however, the disclosure is not limited thereto. In another embodiment, the number of the TIV can be selected based on the demand.

Figure 1C:
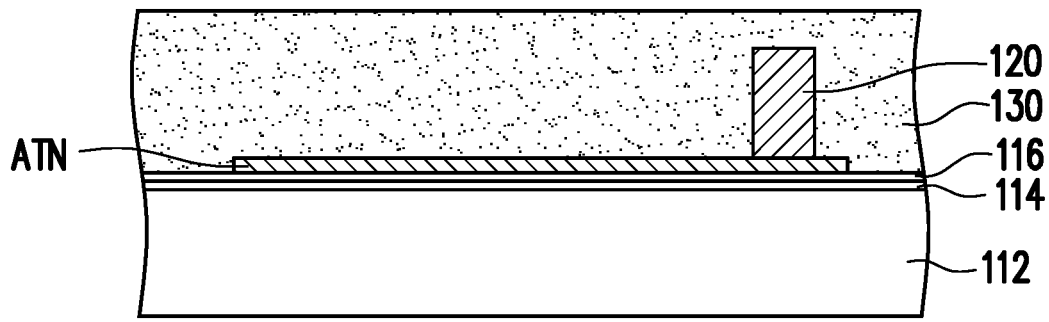

Referring to FIG. 1C, in some embodiments, the antenna element ATN and the TIV 120 are in contact with and molded in a molding compound 130. In some embodiments, the molding compound 130 covers the TIV 120, the antenna element ATN and the dielectric layer 116. In some embodiments, the molding compound 130 covers top surfaces and sidewalls of the TIV 120 and the antenna element ATN, where the top surfaces of the TIV 120 and the antenna element ATN are opposite to the carrier 112. In some embodiments, the material of the molding compound 130 has low permittivity (Dk) and low loss tangent (DO properties. Depending on the frequency range of the high speed applications, suitable materials of the molding compound 130 may be selected based on the required electrical properties of the package structure.

Figure 1D:
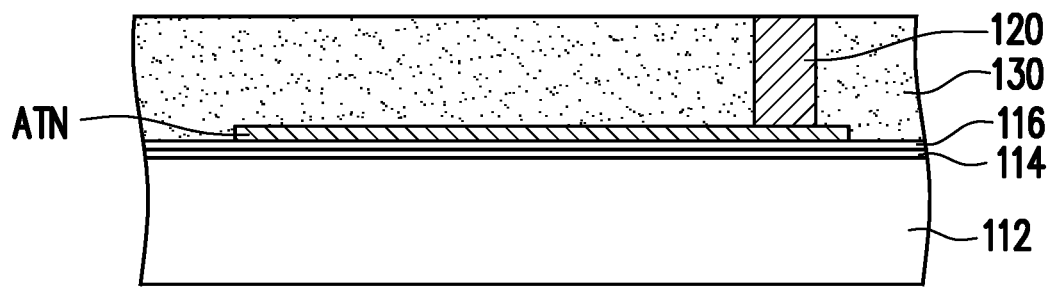

Referring to FIG. 1D, in some embodiments, the molding compound 130 and the TIV 120 are planarized until the TIV 120 is exposed. In certain embodiments, as shown in FIG. 1D, after the planarization, the TIV 120 and the molding compound 130 become substantially leveled. In one embodiment, the top surfaces of the TIV 120 and the molding compound 130 are coplanar. In some embodiments, the molding compound 130 and the TIV 120 are planarized through a grinding process or a chemical mechanical polishing (CMP) process. After the grinding process, a cleaning step may be optionally performed, for example to clean and remove the residue generated from the grinding step. However, the disclosure is not limited thereto, and the planarizing step may be performed through any other suitable method.

Figure 1E:
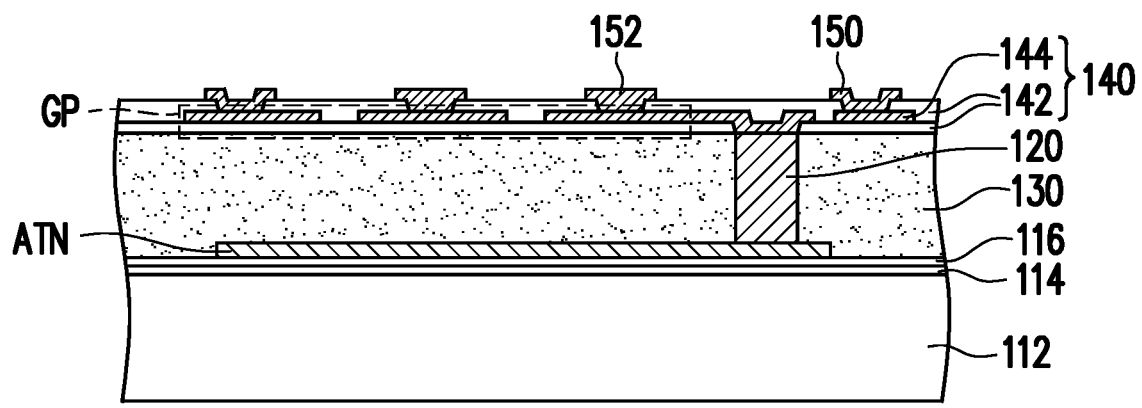

Referring to FIG. 1E, in some embodiments, a first redistribution layer 140 is formed on the TIV 120, the molding compound 130 and the antenna element ATN. In some embodiments, the first redistribution layer 140 is physically connected to the TIV 120 and is electrically connected to the antenna element ATN through the TIV 120. In addition to the routing function provided by the first redistribution layer 140, a part of the first redistribution layer 140 located above and overlapped with the antenna element ATN in the vertical projection is the ground plane portion GP, which functions as a ground plate for the antenna element ATN. In some embodiments, the ground plane portion GP acts as a reflector for antenna radiation and ensures high gain/efficiency for the antenna when there is a specific distance (which is wavelength dependent) between the antenna element ATN and the ground plane portion GP. Owing to such configuration, the distance between the antenna element ATN and the ground plane portion GP is controllable by adjusting the height of the TIV 120, thereby allowing fine pitch for later-formed conductive elements and better flexibility in the design of a printed circuit board (which is connected to the package structure 10 through the later-formed conductive elements). In view thereof, a height of the package structure 10 may further be reduced. Additionally, in the disclosure, except for the molding compound 130, no additional semiconductor element (e.g., passive components or active components) or other element made of metal or metallic materials present between the antenna element ATN and the ground plane portion GP, thereby ensuring the reliability of antenna applications. The formation of the first redistribution layer 140 includes sequentially forming one or more polymer dielectric layers 142 and at least one metallization layer 144 in alternation. In certain embodiments, as shown in FIG. 1E, the metallization layer 144 is sandwiched between the polymer dielectric layers 142, but the top surface of the metallization layer 144 is exposed by the topmost layer of the polymer dielectric layers 142 and the lowest layer of the metallization layers 144 is exposed by the lowest layer of the polymer dielectric layers 142 to connect the TIV 120. In some embodiments, the material of the metallization layers 144 includes aluminum, titanium, copper, nickel, tungsten, and/or alloys thereof, and the metallization layers 144 may be formed by electroplating or deposition. In some embodiments, the material of the polymer dielectric layers 142 includes polyimide, epoxy resin, acrylic resin, phenol resin, benzocyclobutene (BCB), polybenzooxazole (PBO), or any other suitable polymer-based dielectric material.

In some embodiments, a plurality of under-ball metallurgy (UBM) patterns 150 may be disposed on the exposed top surface of the topmost layer of the metallization layers 144 for electrically connecting with conductive elements (e.g. conductive balls), and/or at least one connection pad 152 may be disposed on the exposed top surface of the topmost layer of the metallization layers 144 for electrically connecting with at least one semiconductor elements (e.g., passive components or active components). As shown in FIG. 1E, for example, a plurality of the UBM patterns 150 and a plurality of connection pads 152 are formed. In some embodiments, the materials of the UBM patterns 150 and the connection pads 152 may include copper, nickel, titanium, tungsten, or alloys thereof or the like, and may be formed by an electroplating process, for example. In one embodiment, the material of the UBM patterns 150 may be the same as that of the connection pads 152. In another embodiment, the material of the UBM patterns 150 may be different from that of the connection pads 152. In one embodiment, there may be only the UBM patterns 150 presented in the package structure; however, in another embodiment, there may be only the connection pads 152. The number of the UBM patterns 150 and the connection pad 152 is not limited in this disclosure.

Figure 1F:
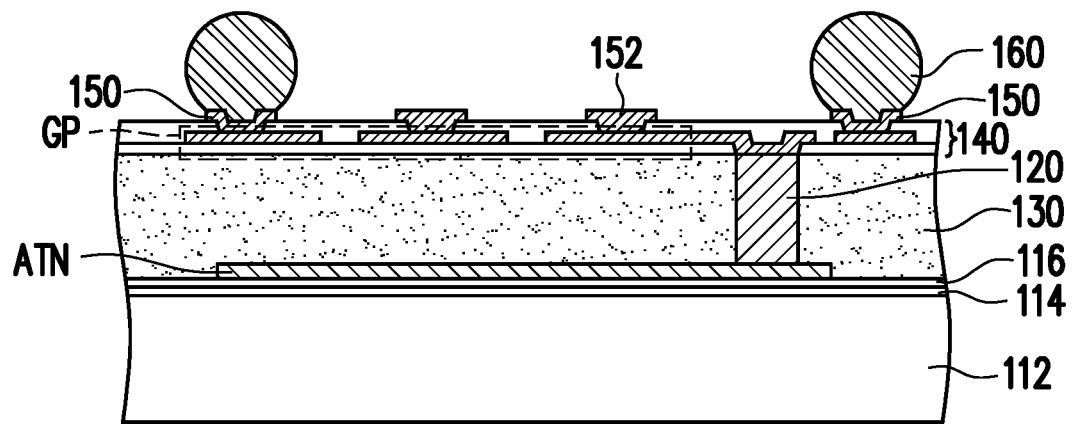

Referring to FIG. 1F, after the first redistribution layer 140 is formed, a plurality of conductive elements 160 are formed on the first redistribution layer 140. As shown in FIG. 1F, the conductive elements 160 are disposed on the UBM patterns 150. In some embodiments, the conductive elements 160 may be disposed on the UBM patterns 150 by ball placement process or reflow process. In some embodiments, the conductive elements 160 are, for example, solder balls or ball grid array (BGA) balls. In some embodiments, the conductive elements 160 are connected to the first redistribution layer 140 through the UBM patterns 150. As shown in the FIG. 1F, some of the conductive elements 160 are electrically connected to the antenna element ATN through the first redistribution layer 140, the TIV 120 and the UBM patterns 150.

Figure 1G:
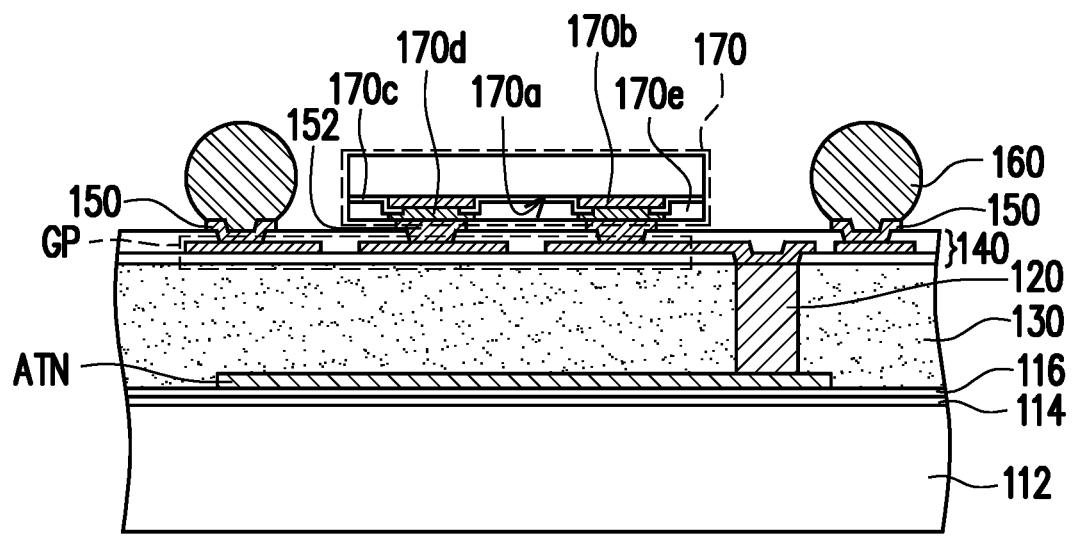

Referring to FIG. 1G, at least one die 170 is provided and disposed on the first redistribution layer 140. As shown in FIG. 1G, the die 170 is disposed on the connection pads 152, and is connected to the first redistribution layer 140 through the connection pads 152. In some embodiments, the die 170 may be disposed on the connection pads 152 through reflow process. In some embodiments, the conductive elements 160 and the die 170 are formed on a surface of the first redistribution layer 140, wherein the first redistribution layer 140 is located between the molding compound 130 and the conductive elements 160 and between the molding compound 130 and the die 170. In some embodiments, as shown in FIG. 1G, the die 170 includes an active surface 170a, a plurality of pads 170b distributed on the active surface 170a, a passivation layer 170c covering the active surface 170a and a portion of the pad 170b, a plurality of conductive pillars 170d, and a protection layer 170e. The pads 170b are partially exposed by the passivation layer 170c, the conductive pillars 170d are disposed on and electrically connected to the pads 170b, and the protection layer 170e covers the passivation layer 170c and exposes the conductive pillars 170d. As shown in FIG. 1G, the die 170 is electrically connected to the first redistribution layer 140 through the conductive pillars 170d and the connection pads 152; the die 170 is electrically connected to some of the conductive elements 160 through the conductive pillars 170d, the connection pads 152, the first redistribution layer 140, and some of the UBM patterns 150; and the die 170 is electrically connected to the antenna element ATN through the conductive pillars 170d, the connection pads 152, the first redistribution layer 140, and the TIV 120. In the disclosure, the die 170 is overlaid the antenna element ATN; that is, a positioning location of the die 170 is overlapped with a positioning location of the antenna element ATN in a vertical projection on the first redistribution layer 140, which allows to reduce a layout area of the package structure 10. Furthermore, the die 170 is not molded in the molding compound 130, a good thermal dissipation is achieved. The conductive pillars 170d are copper pillars, copper alloy pillar or other suitable metal pillars, for example. In some embodiments, the protection layer 170e may be a polybenzoxazole (PBO) layer, a polyimide (PI) layer or other suitable polymers. In some alternative embodiments, the protection layer 170e may be made of inorganic materials, such as silicon oxide, silicon nitride, silicon oxynitride, or any suitable dielectric material. In some embodiments, an underfill material (not shown) may be provided between the die 170 and the connection pads 152 to enhance the reliability of the package.

As shown in FIG. 1G, only one die is presented for illustrative purposes, however, it should be noted that one or more dies may be provided. The die(s) described herein may be referred as a chip or an integrated circuit (IC). In some embodiments, the die 170 includes at least one wireless and radio frequency (RF) chip. In some embodiments, the die 170 may further include additional chip(s) of the same type or different types. In alternative embodiments, more than one die 170 are provided, and the dies 170, except for including at least one wireless and RF chip, may include the same or different types of chips selected from digital chips, analog chips or mixed signal chips, application-specific integrated circuit ("ASIC") chips, sensor chips, memory chips, logic chips or voltage regulator chips.

Figure 1H:
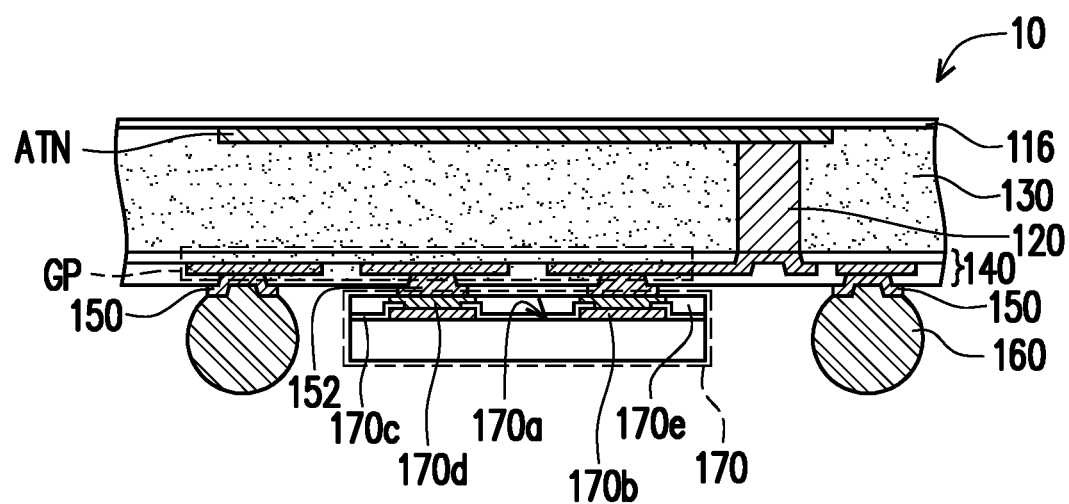

Referring to FIG. 1H, in some embodiments, the carrier 112 is flipped (turned upside down) and then is debonded from the dielectric layer 116 to form the package structure 10. In some embodiments, the dielectric layer 116 is easily separated from the carrier 112 due to the debond layer 114. In some embodiments, the carrier 112 is detached from the dielectric layer 116 through a debonding process and the carrier 112 and the debond layer 114 are removed. In some embodiments, the dielectric layer 116 remained on the antenna element ATN and the molding compound 130 is served as a protection layer. Alternatively, in some embodiments, the dielectric layer 116 may be subsequently removed and the surface of the antenna element ATN is exposed. In some embodiments, a dicing process is performed to cut the wafer having a plurality of the package structures 10 into individual and separated package structures 10. In one embodiment, the dicing process is a wafer dicing process including mechanical blade sawing or laser cutting.

As shown in FIG. 1H, in some embodiments, the package structure 10 includes the at least one TIV 120, the molding compound 130, the first redistribution layer 140, the antenna element ATN, the conductive elements 160, and the at least one die 170. The package structure 10 further includes the UBM patterns 150 and the connection pads 152. In some embodiments, the conductive elements 160 and the die 170 are located on and connected to the first redistribution layer 140 through the UBM patterns 150 and the connection pads 152, respectively. In some embodiments, the conductive elements 160 and the die 170 are located on the same side of the first redistribution layer 140 and are not molded in the molding compound 130 (outside of the molding compound 130), such that a good thermal dissipation is achieved. As shown in FIG. 1H, the TIV 120 connected to the surface of the first redistribution layer 140 is molded in the molding compound 130 and is located at another side of the first redistribution layer 140 opposite to the conductive elements 160 and the die 170. In some embodiments, the first redistribution layer 140 is located between the conductive elements 160 and the molding compound 130 and is between the die 170 and the molding compound 130. In some embodiments, the first redistribution layer 140 is located between the conductive elements 160 and the antenna element ATN and TIV 120 and between the die 170 and the antenna element ATN. In some embodiments, the antenna element ATN is located on and physically connected to the TIV 120, and the antenna element ATN is electrically connected to the first redistribution layer 140 through the TIV 120. As shown in FIG. 1H, the TIV 120 is located between the antenna element ATN and the first redistribution layer 140 and in contact with the antenna element ATN and the first redistribution layer 140, so that the antenna element ATN and the first redistribution layer 140 are electrically connected. In detail, the antenna element ATN and the TIV 120 are in contact with and molded in the molding compound 130, where the top surface of the antenna element ATN and bottom surface of the TIV 120 are not covered by the molding compound 130. In certain embodiments, the antenna element ATN is located above the first redistribution layer 140 and the die 170, wherein a positioning location of the die 170 corresponds to and is overlapped with a positioning location of the antenna element ATN (e.g., the antenna element ATN is overlapped with the die 170 in a vertical projection on the first redistribution layer 140).

Owing to the configuration of the antenna element ATN and the layout of the first redistribution layer 140, the first redistribution layer 140 not only provides routing function but also serves as the ground plane for the antenna element ATN. Referring to FIG. 1H and FIG. 6, the ground plane portion GP includes openings Orp for isolating routings and the pads for connecting the conductive element(s) 160 from the rest of the metallization layer 144 and opening Opc corresponding to the locations of the passive components of the die 170. In some embodiments, the location of the antenna element ATN corresponds to and is overlapped with the location of the ground plane portion GP of the first redistribution layer 140. As the die 170 is located outside of the molding compound 130 and there is no additional semiconductor element (e.g., passive components or active components) located between the antenna element ATN and the ground plane portion GP, better thermal dissipation for the die and better reliability of the package are attained and the array gain and efficiency of the antenna are enhanced. And, a distance between the antenna element ATN and the ground plane portion GP is controllable by adjusting the height of the TIV 120, thereby allowing fine pitch and better flexibility for later-formed conductive elements. Furthermore, due to the positioning location of the die 170 is overlapped with the positioning location of the antenna element ATN in a vertical projection, a compact layout area of the package structure 10 is achieved. In some embodiments, some of the conductive elements 160 are electrically connected to the die 170 through some of the UBM patterns 150, the first redistribution layer 140, the connection pads 152, and the conductive pillars 170d. In some embodiments, some of the conductive elements 160 are electrically connected to the antenna element ATN through the UBM patterns 150, the first redistribution layer 140, and the TIVs 120.

Figure 2A:
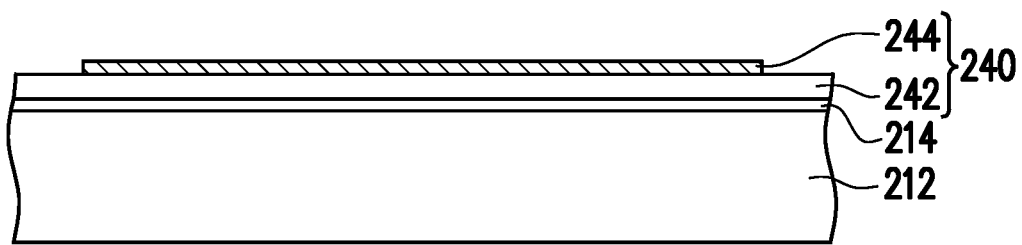
FIG. 2A to FIG. 2N are schematic cross sectional views of various stages in a manufacturing method of a package structure according to some exemplary embodiments of the present disclosure.
Figure 2B:
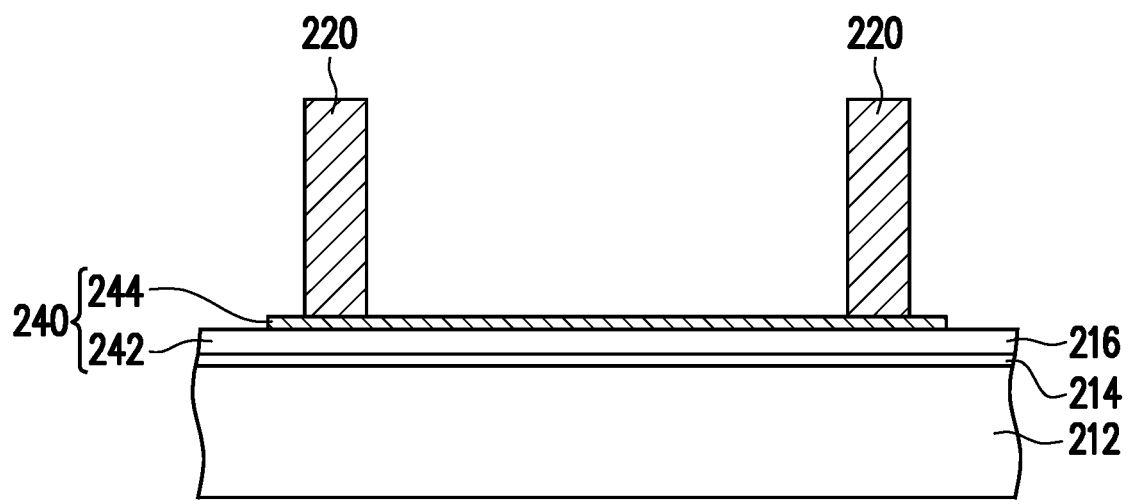
Figure 2C:
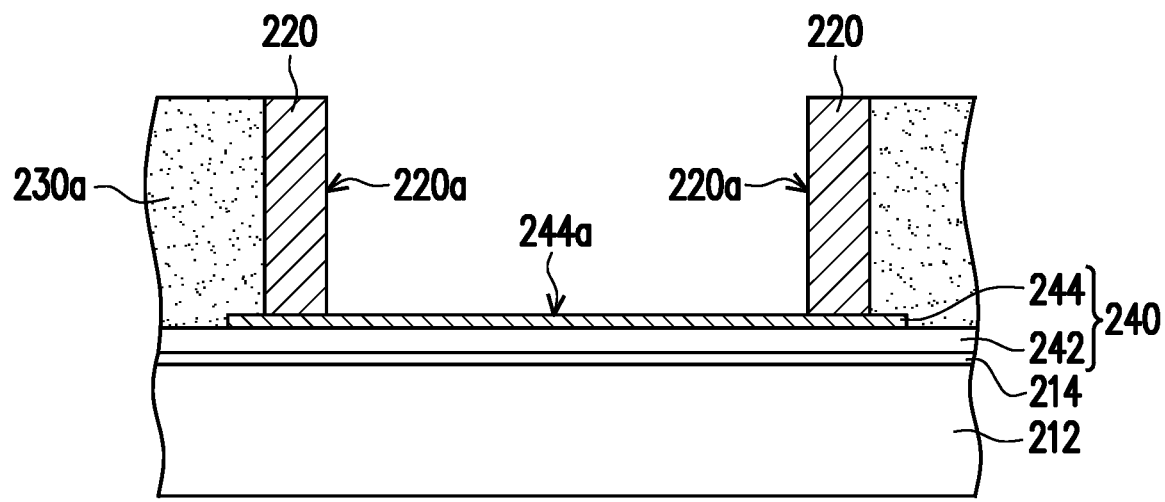
Figure 2D:
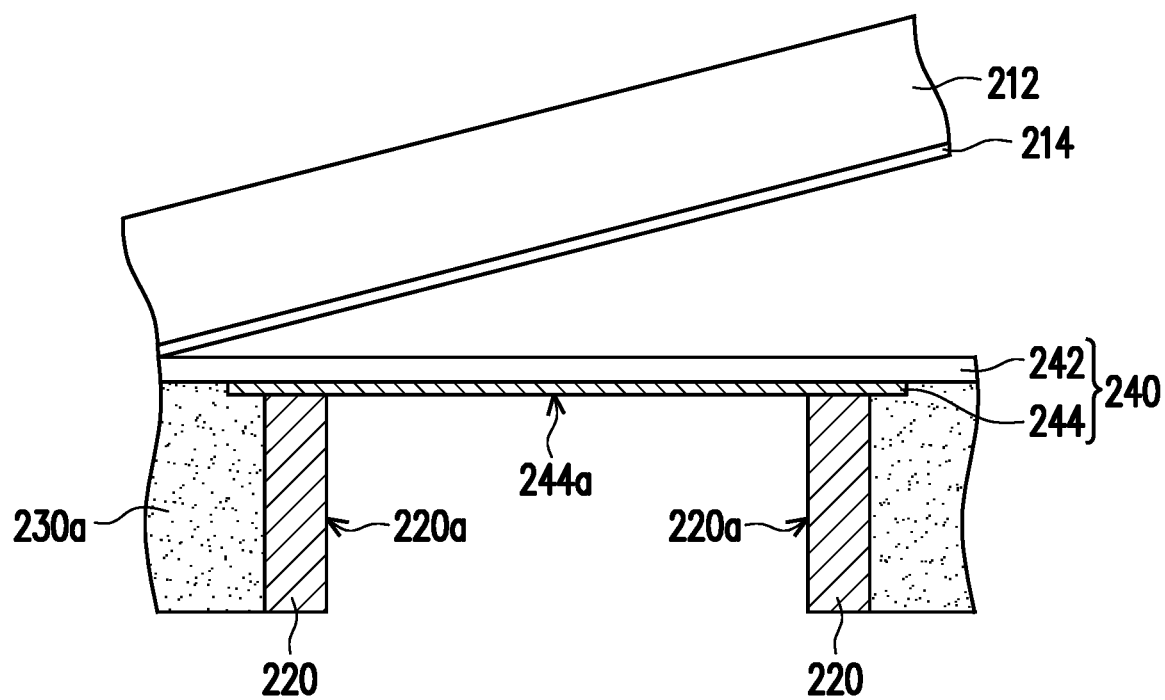
Figure 2E:
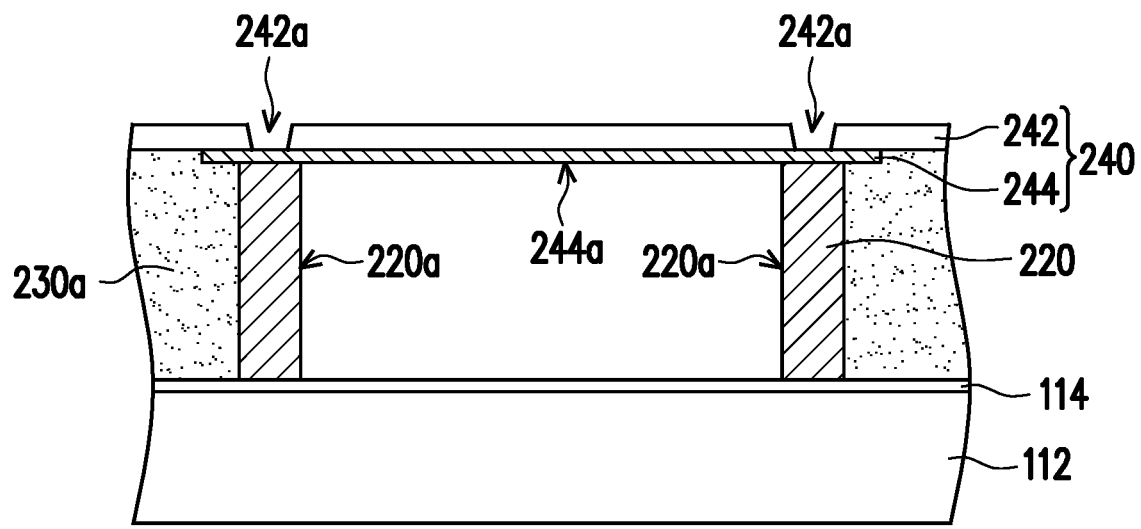
Figure 2F:
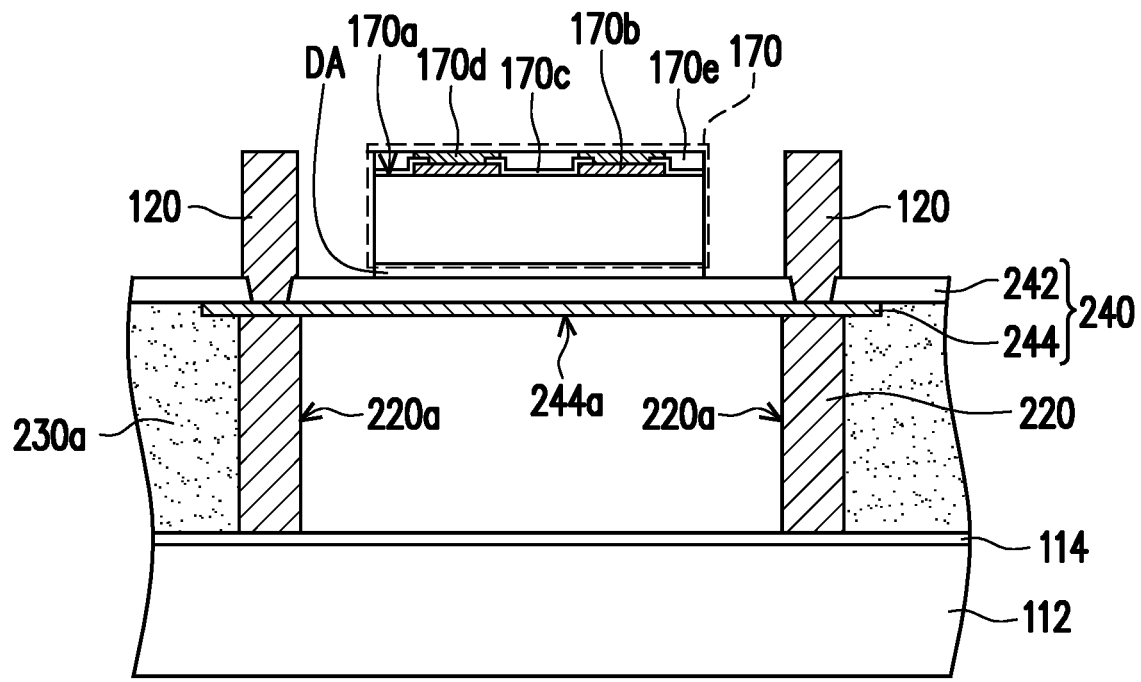
Figure 2G:
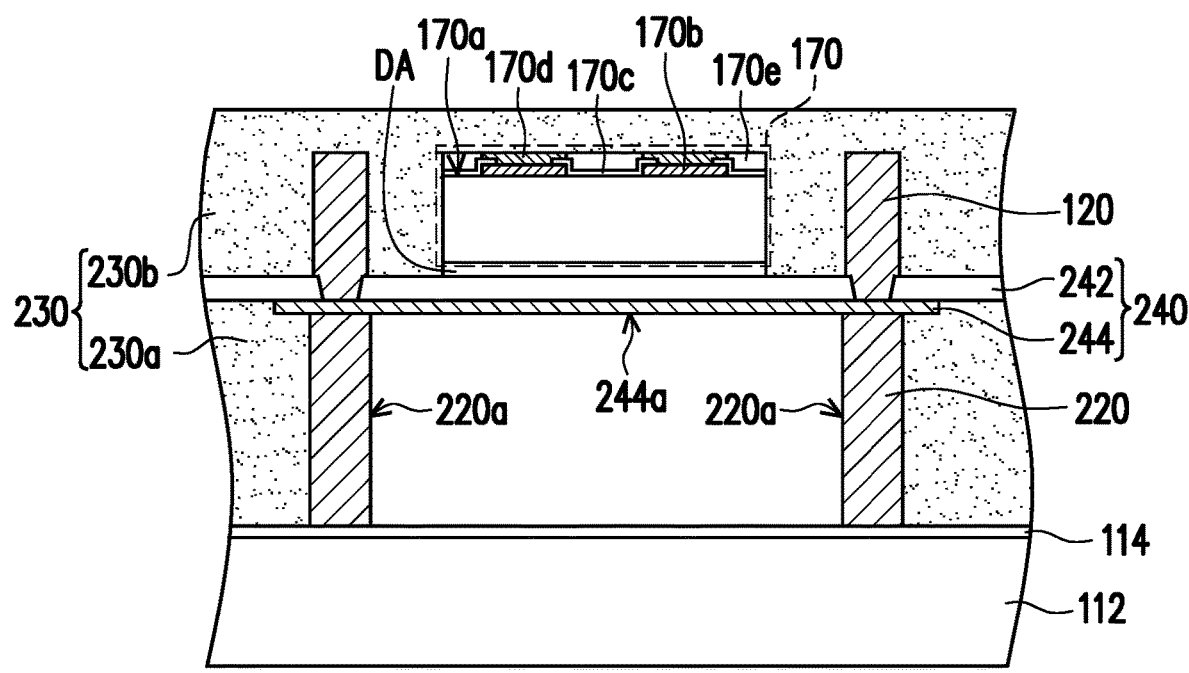
Figure 2H:
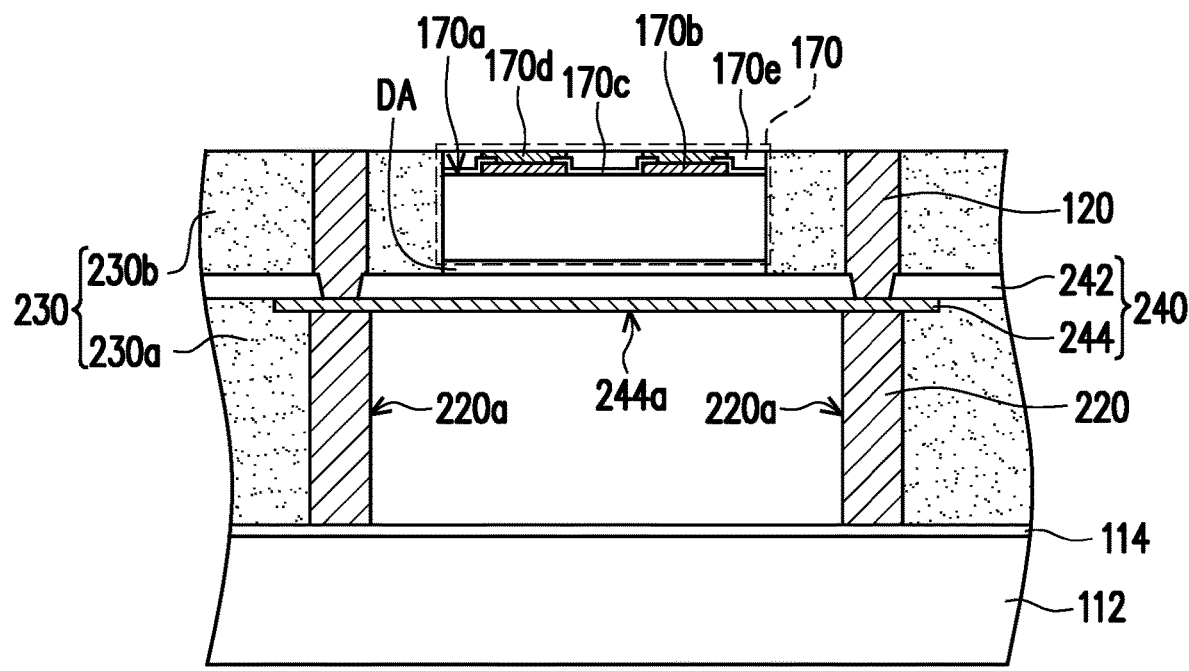
Figure 2I:
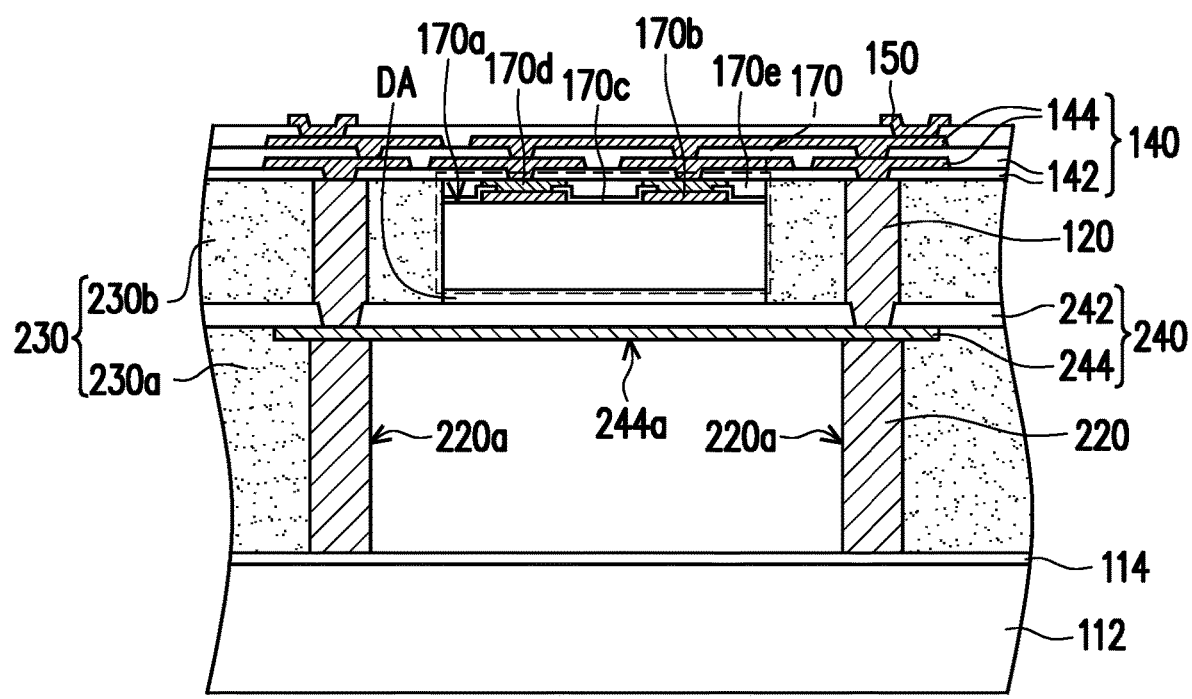
Figure 2J:
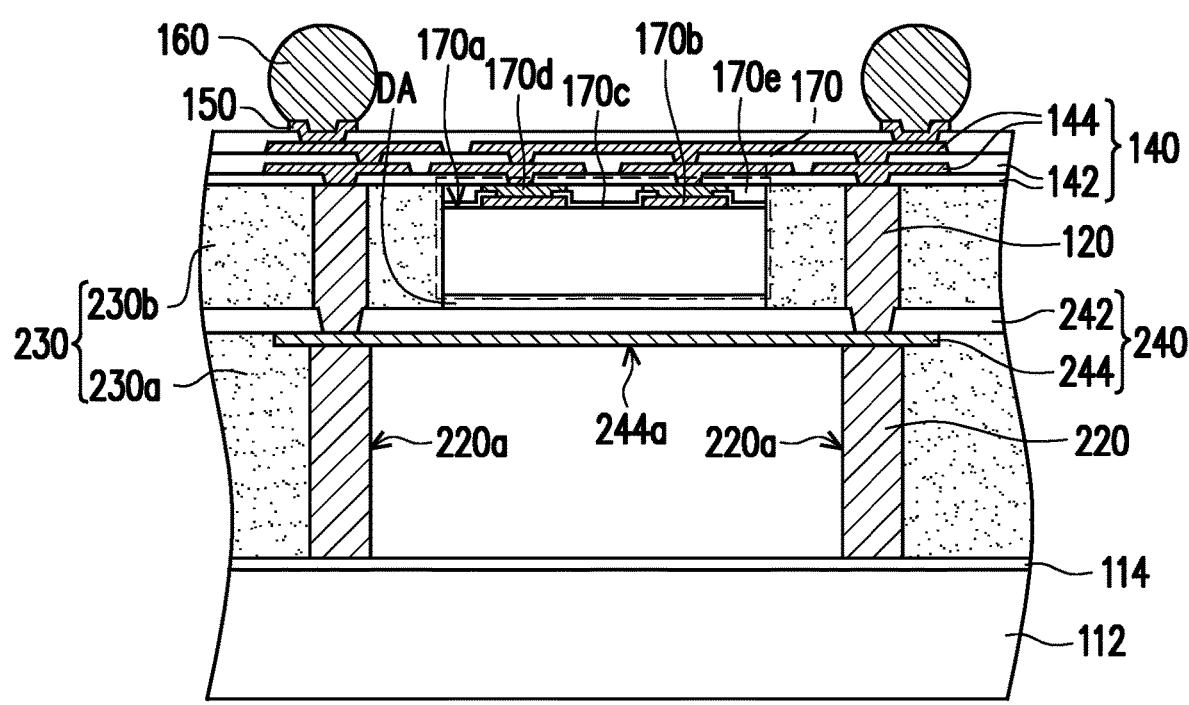
Figure 2K:
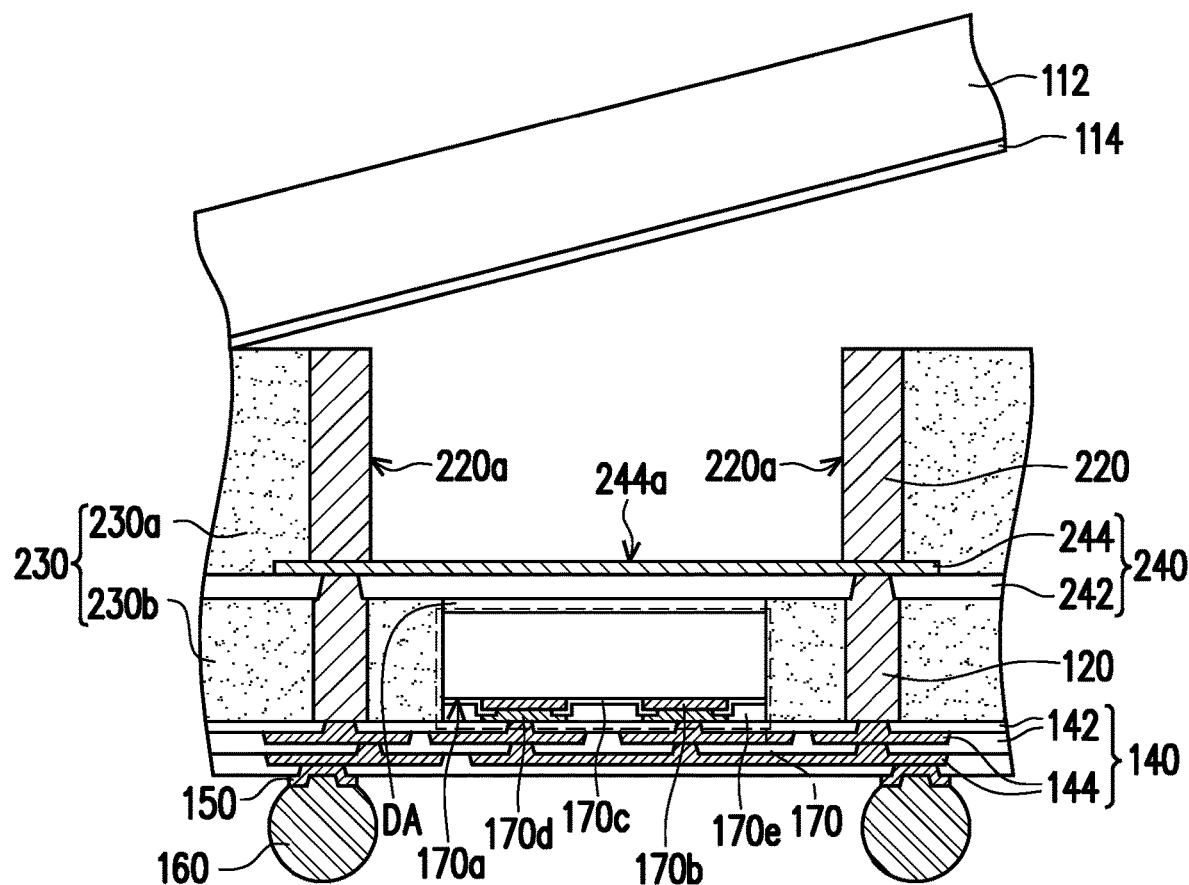
Figure 2L:
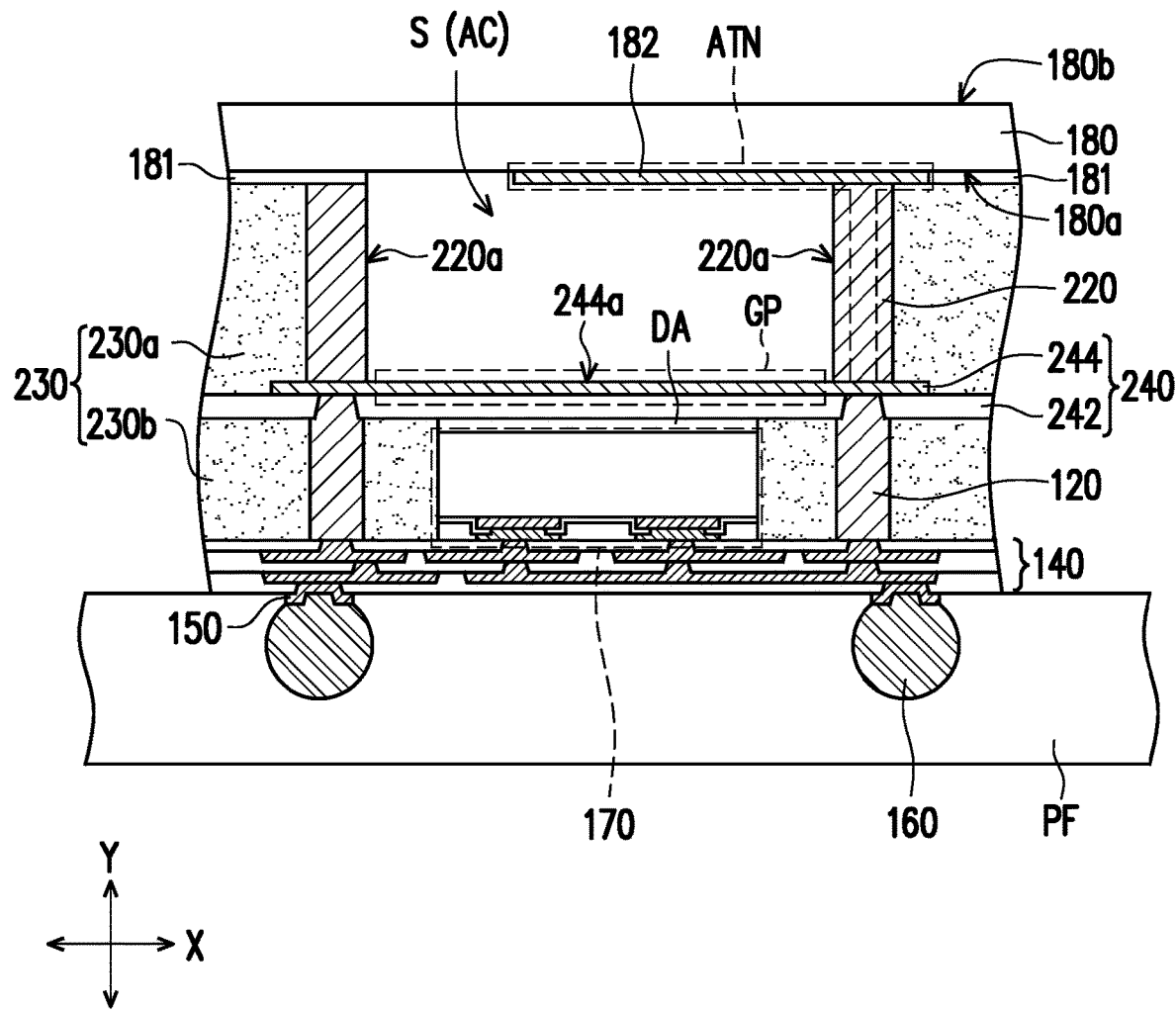
Figure 2M:
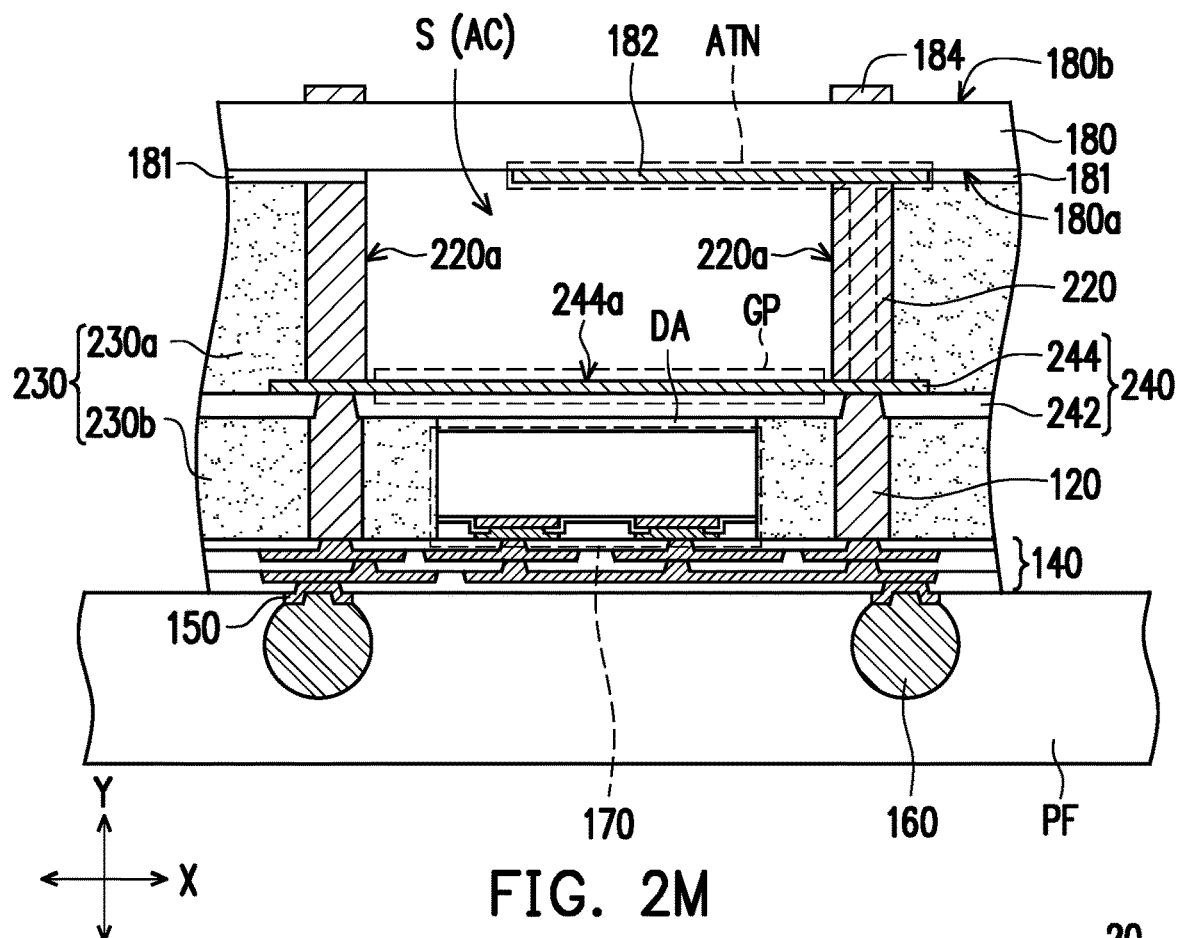
Figure 2N:
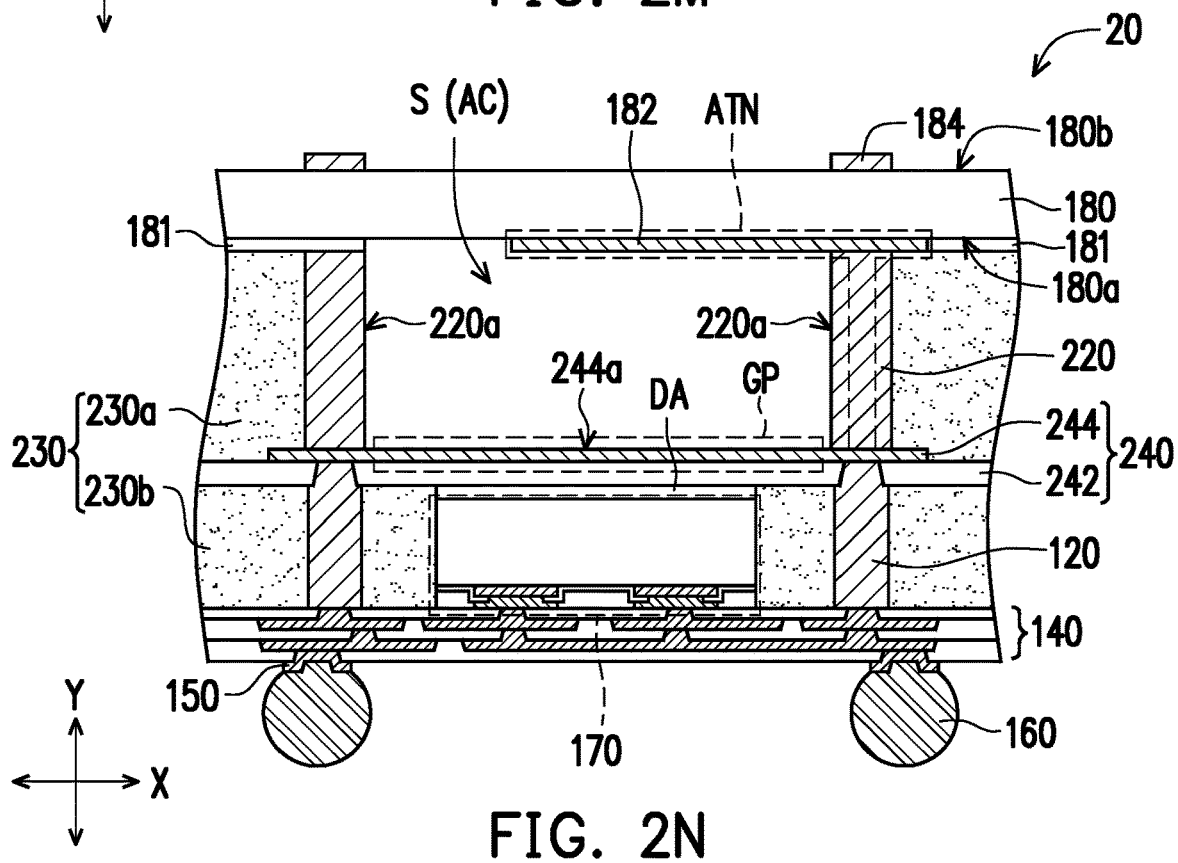
Figure 3:
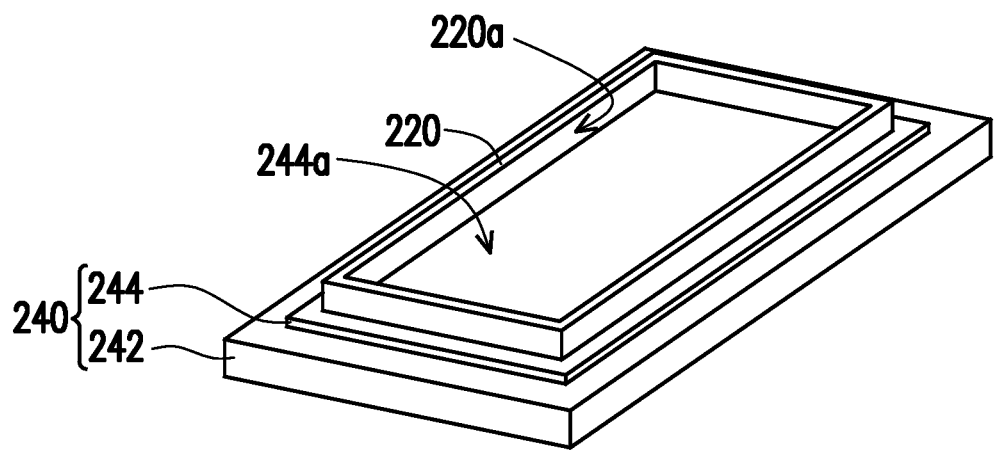
FIG. 3 is a schematic top view illustrating a relative position between a through interlayer via wall and a second redistribution layer depicted in FIG. 2B.
Figure 4:
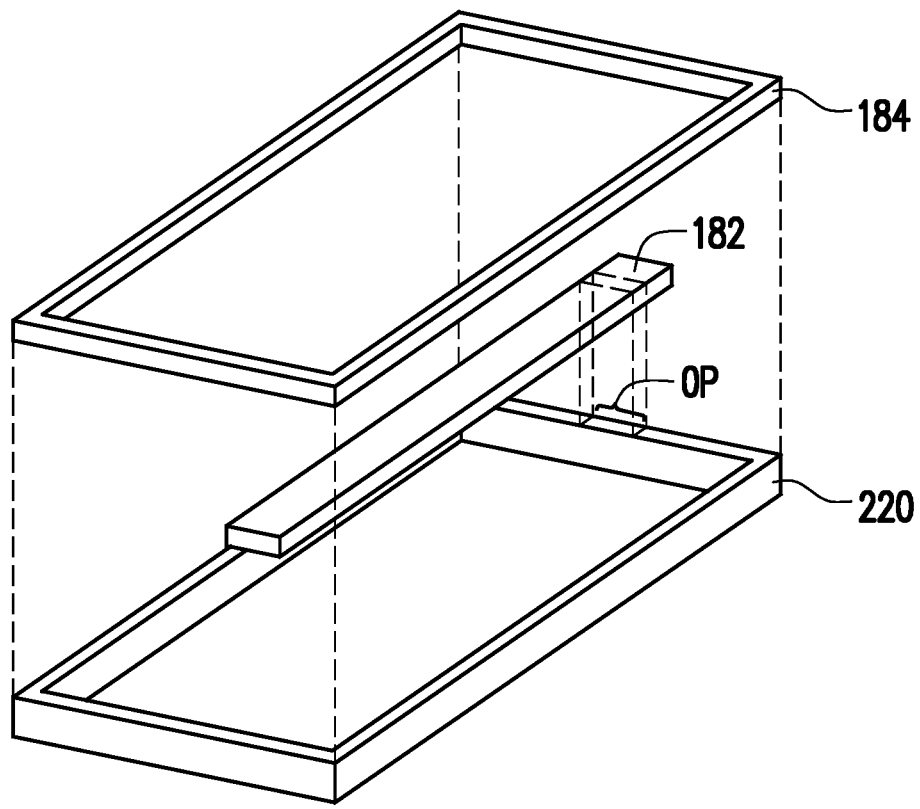
FIG. 4 is a schematic top view illustrating a relative position between a through interlayer via wall and a second metallic pattern depicted in FIG. 2M.

FIG. 2A to FIG. 2N are schematic cross sectional views of various stages in a manufacturing method of a package structure according to some exemplary embodiments of the present disclosure. FIG. 3 is a schematic top view illustrating a relative position between a through interlayer via wall and a second redistribution layer depicted in FIG. 2B. FIG. 4 is a schematic top view illustrating a relative position between a through interlayer via wall and a second metallic pattern depicted in FIG. 2M. The elements similar to or substantially the same as the elements described previously will use the same reference numbers, and certain details or descriptions of the same elements may not be repeated herein. In FIG. 2A to FIG. 2N, one die is shown to represent plural dies of the wafer, and a package structure 20 is shown to represent a package structure obtained following the manufacturing method, for example. In other embodiments, two chips or dies are shown to represent plural chips or dies of the wafer, and one or more package structures are shown to represent plural (semiconductor) package structures obtained following the (semiconductor) manufacturing method, the disclosure is not limited thereto.

Referring to FIG. 2A, in some embodiments, a carrier 212 is provided, and the carrier 212 may be a glass carrier or any suitable carrier for the manufacturing method of the package structure. In some embodiments, the carrier 212 is coated with a debond layer 214. The material of the debond layer 214 may be any material suitable for debonding the carrier 212 from the above layers disposed thereon. Next, a second redistribution layer 240 is formed on the carrier 212. The formation of the second redistribution layer 240 includes sequentially forming one or more polymer dielectric layers 242 and one or more metallization layers 244 in alternation. The materials of the second redistribution layer 240 and the formation methods similar to the processes for forming the first redistribution layer 140 as described in FIG. 1E may not be repeated herein. As shown in FIG. 2A, the second redistribution layer 240 includes one polymer dielectric layer 242 and one metallization layer 244, and a top surface (not marked) of the metallization layer 244 is exposed.

Referring to FIG. 2B, in some embodiments, a through interlayer via (TIV) wall 220 is formed on the carrier 212, and the TIV wall 220 is physically connected to the metallization layer 244. In some embodiments, the TIV wall 220 is a through integrated fan-out (InFO) via, and a shape of the TIV wall is in a form of a hollow rectangular frame (as shown in FIG. 3), a hollow circular frame (not shown), a hollow square frame (not shown), or a hollow polygonal frame (not shown), etc. In certain embodiments, the TIV wall 220 is arranged along the edge of the metallization layer 244. In some embodiments, the TIV wall 220 is formed by photolithography, plating, photoresist stripping processes or any other suitable method. In one embodiment, the TIV wall 220 may be formed by forming a mask pattern (not shown) covering the metallization layer 244 and the polymer dielectric layer 242 with openings exposing a portion of the metallization layer 244, forming a metallic material filling the openings to form the TIV wall 220 by electroplating or deposition and then removing the mask pattern. However, the disclosure is not limited thereto. In one embodiment, the material of the TIV wall 220 may include a metal material such as copper or copper alloys, or the like.

Referring to FIG. 2C, in some embodiments, the second redistribution layer 240 and the TIV wall 220 are partially molded in a molding compound 230a. In some embodiments, the molding compound 230a at least fills the gaps between the TIV wall 220 of two package structures 20 and between the TIV wall 220 and the metallization layer 244, and covers an outer sidewall of the TIV wall (opposite to an inner sidewall 220a), a portion of the polymer dielectric layer 242 exposed by the second redistribution layer 240 and a portion of the second redistribution layer 240. In some embodiments, the molding compound 230a is not formed on the inner sidewall 220a of the TIV wall 220 and a surface (e.g., a surface 244a of the metallization layer 244, see FIG. 3) of the second redistribution layer 240 surrounded by the TIV wall 220. In some embodiments, the molding compound 230a, for example, may include polymers (such as epoxy resins, phenolic resins, silicon-containing resins, or other suitable resins), dielectric materials having low permittivity (Dk) and low loss tangent (DO properties, or other suitable materials. Depending on the frequency range of the high speed applications, suitable materials of the molding compound 230a may be selected based on the required electrical properties of the package structure. In some embodiments, the formation of the molding compound 230a may include placing a mask (not shown) atop the TIV wall 220, in which the inner sidewall 220a of the TIV wall 220 and the surface 244a of the metallization layer 244 of the second redistribution layer 240 are covered by the mask; then forming the molding compound 230a on the TIV wall 220 and the second redistribution layer 240 that are exposed by the mask; finally, removing the mask. In the disclosure, the formation of the molding compound 230a is not limited thereto, other suitable formation method may be applied. In certain embodiments, as shown in FIG. 2C, the TIV wall 220 and the molding compound 230a become substantially leveled. In one embodiment, as shown in FIG. 2C, the top surfaces of the TIV wall 220 and the molding compound 230a are coplanar. In some embodiments, a grinding process or a chemical mechanical polishing (CMP) process may further be applied to planarize the molding compound 230a and the TIV wall 220, and thus the molding compound 230a is leveled with the TIV wall 220. After the grinding process, a cleaning step may be optionally performed, for example to clean and remove the residue generated from the grinding step. However, the disclosure is not limited thereto, and the grinding step may be performed through any other suitable method.

Referring to FIG. 2D, in some embodiments, the carrier 212 is flipped (turned upside down) and then debonded from the second redistribution layer 240. In some embodiments, the second redistribution layer 240 is easily separated from the carrier 212 due to the debond layer 214, and the polymer dielectric layer 242 of the second redistribution layer 240 is exposed. In some embodiments, the carrier 212 is detached from the second redistribution layer 240 through a debonding process and the carrier 212 and the debond layer 214 are removed.

Referring to FIG. 2E, in some embodiments, the second redistribution layer 240 is placed on a carrier 112. In some embodiments, the carrier 112 is coated with a debond layer 114. The material of the debond layer 114 may be any material suitable for debonding the carrier 112 from the above layers disposed thereon. As shown in FIG. 2D, the second redistribution layer 240 debonded from the carrier 212 is disposed on the carrier 112 by contacting the TIV wall 220 and the carrier 112 to the debond layer 114. Next, the polymer dielectric layer 242 of the second redistribution layer 240 exposed is patterned to form openings 242a exposing a portion of the metallization layer 244, see FIG. 2E. In some embodiments, patterning the polymer dielectric layer 242 of the second redistribution layer 240 can be performed by laser drilling.

Referring to FIG. 2F, in some embodiments, one or more through interlayer vias (TIVs) 120 are formed on the carrier 112, and the TIV 120 is physically connected to the metallization layer 244 of the second redistribution layer 240. As shown in FIG. 2F, the TIVs 120 are formed on the second redistribution layer 240 and electrically connected to the TIV wall 220 through the metallization layer 244 exposed by the openings 242a. The material of the TIVs 120 and the formation method is the same or similar to what is described in FIG. 1B, and thus is not repeated herein.

As shown in FIG. 2F, at least one die 170 is provided and disposed on the second redistribution layer 240. In some embodiments, a die attach film DA is provided between a back side (not marked) of the die 170 and the polymer dielectric layer 242 of the second redistribution layer 240, so as the die 170 are stably adhered to the polymer dielectric layer 242 of the second redistribution layer 240. In some embodiments, as shown in FIG. 2F, the die 170 includes an active surface 170a (opposite to the back side of the die 170), a plurality of pads 170b distributed on the active surface 170a, a passivation layer 170c covering the active surface 170a and a portion of the pad 170b, a plurality of conductive pillars 170d, and a protection layer 170e. The pads 170b are partially exposed by the passivation layer 170c, the conductive pillars 170d are disposed on and electrically connected to the pads 170b, and the protection layer 170e covers the passivation layer 170c and exposes the conductive pillars 170d. The types of the die 170 and the materials of components of the die 170 are the same or similar to what is described in FIG. 1G, and thus is not repeated herein.

Referring to FIG. 2G, in some embodiments, the TIVs 120 and the die 170 are molded in a molding compound 230b. In some embodiments, the molding compound 230b at least fills the gaps between the TIVs 120 and between the TIVs 120 and the die 170, and covers sidewalls and top surfaces of the TIVs 120 and the die 170 and a surface of the polymer dielectric layer 242 exposed by the TIVs 120 and the die 170. In some embodiments, the molding compound 230b, for example, may include polymers (such as epoxy resins, phenolic resins, silicon-containing resins, or other suitable resins), dielectric materials having low permittivity (Dk) and low loss tangent (DO properties, or other suitable materials. Depending on the frequency range of the high speed applications, suitable materials of the molding compound 230b may be selected based on the required electrical properties of the package structure. In the disclosure, the molding compound 230a and the molding compound 230b are together referred as the molding compound 230; that is, the molding compound 230 includes the molding compound 230a and the molding compound 230b. In one embodiment, the materials of the molding compound 230a and the molding compound 230b can be the same, however the disclosure is not limited thereto. In one embodiment, the materials of the molding compound 230a and the molding compound 230b can be different.

Referring to FIG. 2H, in some embodiments, the molding compound 230b and the TIVs 120 are planarized until and the top surfaces of the TIVs 120 and the conductive pillars 170d and the protection layer 170e of the die 170 are exposed. In certain embodiments, as shown in FIG. 2H, after the planarization, the conductive pillars 170d and the protection layer 170e of the die 170 become substantially leveled with the TIVs 120 and the molding compound 230b. In one embodiment, the top surfaces of the TIVs 120, the conductive pillars 170d, the protection layer 170e and the molding compound 230b are coplanar. In some embodiments, the molding compound 230b and the TIVs 120 are planarized through a grinding process or a chemical mechanical polishing (CMP) process. After the grinding process, a cleaning step may be optionally performed, for example to clean and remove the residue generated from the grinding step. However, the disclosure is not limited thereto, and the planarizing step may be performed through any other suitable method.

Referring to FIG. 2I, in some embodiments, a first redistribution layer 140 is formed on the carrier 112. In some embodiments, the first redistribution layer 140 is formed on the TIVs 120, the die 170 and the molding compound 230 (including the molding compound 230a and the molding compound 230b), and is physically connected to the die 170 and the TIVs 120. As shown in FIG. 2I, the first redistribution layer 140 is electrically connected to the second redistribution layer 240 through the TIVs 120, the first redistribution layer 140 is electrically connected to the die 170 through the pads 170b and the conductive pillars 170d, and the first redistribution layer 140 is electrically connected to the second TIV wall through the TIVs 120 and the second redistribution layer 240. In some embodiments, the first redistribution layer 140 includes one or more polymer dielectric layers 142 and one or more metallization layers 144 arranged in alternation. The material of the first redistribution layer 140 and the formation method is described in FIG. 1E, and thus is not repeated herein. As shown in FIG. 2I, the die 170 is disposed between the first redistribution layer 140 and the second redistribution layer 240.

Next, in some embodiments, a plurality of under-ball metallurgy (UBM) patterns 150 may be disposed on some of the top surface of the topmost layer of the metallization layers 144 exposed by the topmost layer of the polymer dielectric layers 142 for electrically connecting with conductive elements (e.g. conductive balls). As shown in FIG. 2I, for example, a plurality of the UBM patterns 150 are formed. In some embodiments, the materials of the UBM patterns 150 may include copper, nickel, titanium, tungsten, or alloys thereof or the like, and may be formed by an electroplating process, for example. The number of the UBM patterns 150 is not limited in this disclosure.

Referring to FIG. 2J, in some embodiments, after the first redistribution layer 140 is formed, a plurality of conductive elements 160 are formed on the first redistribution layer 140, and are electrically connected to the first redistribution layer 140 through the UBM patterns 150. In some embodiments, the first redistribution layer 140 is located between the molding compound 230 and the conductive elements 160, between the conductive elements 160 and the die 170, and between the conductive elements 160 and the TIVs 120. As shown in FIG. 2J, the conductive elements 160 are physically connected to the UBM patterns 150. In some embodiments, the conductive elements 160 may be disposed on the UBM patterns 150 by ball placement process or reflow process. In some embodiments, the conductive elements 160 are, for example, solder balls or ball grid array (BGA) balls. In some embodiments, the conductive elements 160 are electrically connected to the first redistribution layer 140 through the UBM patterns 150. In some embodiments, some of the conductive elements 160 are electrically connected to the die 170 through the UBM patterns 150, the first redistribution layer 140, and the conductive pillars 170d of the die 170. In some embodiments, some of the conductive elements 160 are electrically connected to the second redistribution layer 240 through the UBM patterns 150, the first redistribution layer 140, and the TIVs 120.

Referring to FIG. 2K, in some embodiments, the carrier 112 is flipped (turned upside down) and then debonded from the molding compound 230 and the TIV wall 220. The molding compound 230 and the TIV wall 220 are easily separated from the carrier 112 due to the debond layer 114, and the inner sidewall 220a of the TIV wall 220, the surface 244a of the metallization layer 244 surrounded by the TIV wall 220, and a surface of the molding compound 230 are exposed. In some embodiments, the carrier 112 is detached from the molding compound 230, the TIV wall 220 and the molding compound 230 through a debonding process and the carrier 112 and the debond layer 114 are removed.

Referring to FIG. 2L, in some embodiments, the conductive elements 160 are mounted into a polymer film PF, wherein the conductive elements 160 are completely embedded in the polymer film PF. In some embodiments, the material of the polymer film PF may include a polymer film having sufficient elasticity to allow the conductive elements 160 being embedded therein. In some embodiments, the polymer film PF may be a parafilm or a film made of other suitable soft polymer materials or the like. Next, as shown in FIG. 2L, in some embodiments, a cap layer 180 having a first metallic pattern 182 disposed thereon is provided and is disposed on the molding compound 230 and the TIV wall 220 debonded from the carrier 112. In some embodiments, the material of the cap layer 180 may include dielectric materials having low permittivity (Dk) and low loss tangent (DO properties, or other suitable materials; for example, fused silica (having Dk~3.80 and Df<0.001). In certain embodiments, the cap layer 180 is disposed on the TIV wall 220 and the molding compound 230 through adhesives. In some embodiments, as shown in FIG. 2L and FIG. 4, disposing the cap layer 180 on the TIV wall 220 and the molding compound 230, for example, include connecting at least a portion of the first metallic pattern 182 to a portion of the TIV wall 220 of a predetermined overlapping region OP through a conductive adhesive material (not shown), as so the first metallic pattern 182 is electrically connected to the TIV wall 220, and connecting a surface 180a of the cap layer 180 exposed by the first metallic pattern 182 to the rest of the TIV wall 220 and the molding compound 230 through the adhesive layer 181. In the disclosure, the material of the adhesives layer 181 can be any suitable non-conductive adhesives or glues.

Figure 5:
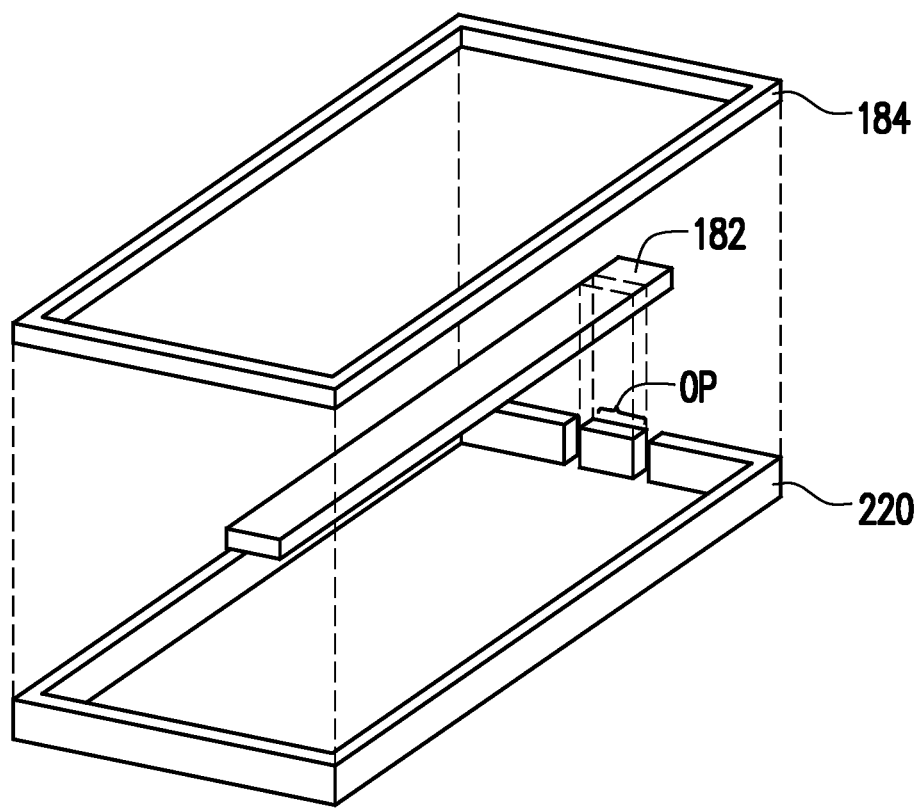
FIG. 5 is a schematic top view illustrating a relative position between a through interlayer via wall and a second metallic pattern according to some exemplary embodiments of the present disclosure.

In an alternative embodiment, as shown in FIG. 2L and FIG. 5, a portion of the first metallic pattern 182 is connected to the portion of the TIV wall 220 of a predetermined overlapping region OP through a conductive adhesive material (not shown), wherein the portion of the TIV wall 220 of the predetermined overlapping region OP connected to the first metallic pattern 182 is separated from the rest of the TIV wall by gaps, and the first metallic pattern 182 and the portion of the TIV wall 220 of the predetermined overlapping region OP connected to the first metallic pattern 182 are electrically connected to the rest of the TIV wall 220 through the metallization layer 244 of the second registration layer 240; and the surface 180a of the cap layer 180 exposed by the first metallic pattern 182 is connected to the rest of the TIV wall 220 and the molding compound 230 through the adhesive layer 181. In some embodiments, prior to disposing the cap layer 180 on the TIV wall 220 and the molding compound 230, a patterning process may be performed to form gaps in the TIV wall, as shown in FIG. 5. For example, the patterning process may include photolithography and etching.

As shown in FIG. 2L, a surface of the first metallic pattern 182 opposite to the cap layer 180, the first side 180a of the cap layer 180, the surface 244a of the metallization layer 244 of the second redistribution layer 240, the inner sidewall 220a of the TIV wall 220 together define an empty space S (i.e. an air cavity AC), where the air has low permittivity (Dk) and low loss tangent (DO properties. In some embodiments, the first metallic pattern 182 and the portion of the TIV wall 220 connected to the first metallic pattern 182 together form an antenna element ATN, wherein the first redistribution layer 140 is not only providing a routing function but a part of the second redistribution layer 240 located below and overlapped with the antenna element ATN is served as a ground plane portion GP for the antenna element ATN. Owing to such configuration, a distance between the antenna element ATN and the ground plane portion GP is controllable by adjusting the height of the TIV wall 220, thereby allowing fine pitch for later-formed conductive elements and better flexibility in the design of a printed circuit board (which is connected to the package structure 20 through the later-formed conductive elements). In the disclosure, the ground plane portion GP acts as a reflector for antenna radiation and ensures its high gain/efficiency when there is certain distance (which is wavelength dependent) between the antenna element ATN and the ground plane portion GP. Due to the cap layer 180 and the TIV wall 220, the antenna element ATN is capable of having high-gain radiation along a first direction Y and avoiding surface wave/edge radiation along a second direction X. Additionally, in the disclosure, no additional semiconductor element (e.g., passive components or active components) or other element made of metal material and/or high-k dielectric materials is presented between the antenna element ATN and the ground plane portion GP, thereby ensuring the reliability of antenna applications. As shown in FIG. 2L, the antenna element ATN is overlaid the die 170; that is, a positioning location of the die 170 is overlapped with a positioning location of the antenna element ATN in a vertical projection on the first redistribution layer 140, which allows to reduce a layout area of the package structure 20 as comparing to a conventional side-by-side configuration of an antenna element and a ground plate. As shown in FIG. 2L, the antenna element ATN partially contacts the molding compound 230a.

Referring to FIG. 2M, in some embodiments, after the cap layer 180 is disposed on the TIV wall 220 and the molding compound 230, a second metallic pattern 184 is formed on a second side 180b of the cap layer 180, wherein the second side 180b is opposite to the first side 180a disposed with the first metallic pattern 182 (or saying, the antenna element ATN). In some embodiments, the second metallic pattern 184 is disposed over the TIV wall 220, wherein the second metallic pattern 184 is formed in a metallic ring structure, and a shape of the second metallic pattern 184 corresponds to a shape of the TIV wall 220 (see FIG. 4), and the cap layer 180 is located between the first metallic pattern 182 (and the antenna element ATN) and the second metallic pattern 184. The surface wave/edge radiation of the antenna element ATN along the second direction X is reduced due to the second metallic pattern 184 enables the surface wave to be reflected and thus reduces the unwanted edge radiation in the antenna system. In some embodiments, the second metallic pattern 184 is formed by photolithography, deposition, photoresist stripping processes or any other suitable method. In one embodiment, the second metallic pattern 184 may be formed by forming a mask pattern (not shown) covering the second side 180b of the cap layer 180 with openings exposing a portion of the cap layer 180, forming a metallic material filling the openings to form second metallic pattern 184 by deposition and then removing the mask pattern, but the disclosure is not limited thereto. In one embodiment, the material of the second metallic pattern 184 may include a metal material such as copper or copper alloys, or the like. However, the disclosure is not limited thereto; in an alternative embodiment, the second metallic pattern 184, for example, may be formed on the cap layer 180 prior to disposing the cap layer 180 on the TIV wall 220 and the molding compound 230.

Referring to FIG. 2N, in some embodiments, the conductive elements 160 is released from the polymer film PF to form the package structure 20, and the first redistribution layer 140 and the conductive elements 160 are exposed. In some embodiments, a dicing process is performed to cut the wafer having a plurality of the package structures 20 into individual and separated package structures 20. In one embodiment, the dicing process is a wafer dicing process including mechanical blade sawing or laser cutting.

Referring to FIG. 2N, in some embodiments, the package structure 20 includes the TIVs 120, the first redistribution layer 140, the conductive elements 160, the at least one die 170, the cap layer 180, the first metallic pattern 182, the second metallic pattern 184, the TIV wall 220, the molding compound 230 (including the molding compound 230a and the molding compound 230b), the second redistribution layer 240, and the antenna element ATN. The package structure 20 further includes the UBM patterns 150. In some embodiments, the die 170 and the TIVs 120 located aside the die 170 are located on and physically connected to the first redistribution layer 140, and are molded in the molding compound 230 (e.g. the molding compound 230b). The conductive elements 160 are disposed on a surface of the first redistribution layer 140 opposite to the die 170 and the TIVs 120, and the first redistribution layer 140 is located between the conductive elements 160 and the molding compound 230. As shown in FIG. 2N, the second redistribution layer 240 is located on the molding compound 230 (e.g. the molding compound 230a), the TIVs 120, the die 170 and the first redistribution layer 140, and the second redistribution layer 240 is electrically connected to the first redistribution layer 140 through the TIVs 120 and is electrically connected to the first metallic pattern 182 through the TIV wall 220. The TIVs 120 and the die 170 are located between the first redistribution layer 140 and the second redistribution layer 240.

In some embodiment, the TIV wall 220 is located on and physically connected to the second redistribution layer 240, wherein the TIV wall 220 and the second redistribution layer 240 are partially molded in the molding compound 230a of the molding compound 230, and the inner sidewall 220a of the TIV wall 220 and the surface 244a of the second redistribution layer 240 are neither covered by nor in contact with the molding compound 230 (e.g. the molding compound 230a). As shown in FIG. 2N, the TIV wall 220 is electrically connected to the TIVs 120 through the second redistribution layer 240, and is electrically connected to the first redistribution layer 140 through the second redistribution layer 240 and the TIVs 120. In some embodiments, the cap layer 180 is located on the molding compound 230 (e.g., the molding compound 230a) and between the first metallic pattern 182 and the second metallic pattern 184, wherein the first metallic pattern 182 located on the surface 180a of the cap layer 180 is electrically connected to a portion of the TIV wall 220, and the second metallic pattern 184 is located on the surface 180b of the cap layer 180 is located over and overlapped with the TIV wall 220 along a vertical projection on the first redistribution layer 140. As shown in FIG. 2N, the first metallic pattern 182 is located on the molding compound 230 and the TIV wall 220, the cap layer 180 is located on and covers the first metallic pattern 182, and the second metallic pattern 184 is located on the cap layer 180, wherein the cap layer 180 is sandwiched between the first metallic pattern 182 and the second metallic pattern 184. In some embodiments, the molding compound 230 is located between the cap layer 180 and the first redistribution layer 140.

In some embodiments, as shown in FIG. 2N, the first metallic pattern 182 and the portion of the TIV wall 220 connected to the first metallic pattern 182 together form the antenna element ATN, wherein the first redistribution layer 140 is not only providing a routing function but a part of the second redistribution layer 240 located below the antenna element ATN is served as a ground plane portion GP for the antenna element ATN. Owing to such configuration, a distance between the antenna element ATN and the ground plane portion GP is controllable by adjusting the height of the TIV wall 220, thereby allowing fine pitch for later-formed conductive elements and better flexibility in the design of a printed circuit board (which is connected to the package structure 20 through the later-formed conductive elements). The ground plane portion GP acts as a reflector for antenna radiation and ensures its high gain/efficiency when there is certain distance (which is wavelength dependent) between the antenna element ATN and the ground plane portion GP. Due to the existence of the air cavity AC (air within the cavity having Dk=1, Df~0) located between the cap layer 180 and the TIV wall 220, the antenna element ATN is capable of having high-gain radiation along the first direction Y and avoiding surface wave/edge radiation along the second direction X. Additionally, in the disclosure, no additional semiconductor element (e.g., passive components or active components) or other element made of metal material and/or high-k dielectric materials is presented between the antenna element ATN and the ground plane portion GP, thereby ensuring the reliability of antenna applications. In some embodiments, the antenna element ATN is located between the cap layer 180 and the second redistribution layer 240. In some embodiments, some of the conductive elements 160 are electrically connected to the die 170 through the UBM patterns 150, the first redistribution layer 140, and the conductive pillars 170d. In some embodiments, some of the conductive elements 160 are electrically connected to the second redistribution layer 240 through the UBM patterns 150, the first redistribution layer 140, and the TIVs 120. In some embodiments, some of the conductive elements 160 are electrically connected to the antenna element ATN through the UBM patterns 150, the first redistribution layer 140, the TIVs 120, the second redistribution layer 240 and the TIV wall 220.

In some embodiments, the antenna element ATN partially contacts the molding compound 230 (e.g. the molding compound 230a), wherein the side of the antenna element ATN facing toward the second redistribution layer 240, the side of the second redistribution layer 240 facing toward the antenna element ATN, the inner sidewall 220a of the TIV wall 220 that are not covered by the molding compound 230 (either the molding compound 230a or the molding compound 230b) together define the space S for the air cavity AC. As shown in FIG. 2N, the air cavity AC is located between the antenna element ATN, the second redistribution layer 240, and the TIV wall 220. In certain embodiments, the antenna element ATN is electrically connected to the second redistribution layer 240 through the TIV wall 220 and is overlaid the die 170. That is, the positioning location of the die 170 is overlapped with the positioning location of the antenna element ATN in a vertical projection on the first redistribution layer 140, which leads to a smaller layout area of the package structure 20 when comparing to a conventional side-by-side configuration of an antenna element and a ground plate. In some embodiments, the shape of the second metallic pattern 184 located over the TIV wall 220 corresponds to the shape of the TIV wall 220 (as shown in FIG. 4). Owing to the second metallic pattern 184, the surface wave/edge radiation of the antenna element ATN along the second direction X is reduced.

According to some embodiments, a package structure includes a molding compound, an antenna element, at least one die, and a redistribution layer. The antenna element is molded in the molding compound. The at least one die is located on the molding compound. The redistribution layer is located between the at least one die and the molding compound, wherein the redistribution layer includes a ground plane portion and a location of the antenna element is overlapped with a location of the ground plane portion in a vertical projection.

According to some embodiments, a package structure includes at least one die, an antenna element, and a through interlayer via wall. The antenna element is located above the at least one die. The through interlayer via wall is located between the antenna element and the at least one die, wherein the through interlayer via wall is connected to the antenna element, an air cavity is located between the antenna element and the at least one die and surrounded by the through interlayer via wall, and the antenna element is electrically connected to the at least one die.

According to some embodiments, a manufacturing method of a package structure is provided with the following steps, forming a first redistribution layer on a first carrier; forming at least one through interlayer via on the first carrier, wherein the at least one through interlayer via is electrically connected to the first redistribution layer; encapsulating the at least one through interlayer via in a molding compound; disposing at least one die on the first carrier, wherein the at least one die is electrically connected to the first redistribution layer; forming an antenna element, wherein the antenna element is at least partially in contact with the molding compound and electrically connected to the first redistribution layer, and the antenna element is overlapped with the at least one die in a vertical projection on the first redistribution layer; and disposing conductive elements on the first redistribution layer, wherein the first redistribution layer is located between the molding compound and the conductive elements.

According to some embodiments, a package structure includes a molding compound, an antenna element, at least one die, and a redistribution layer. The antenna element is molded in the molding compound. The at least one die is located on the molding compound. The redistribution layer is located between the at least one die and the molding compound, wherein the redistribution layer includes a ground plane portion and a location of the antenna element is overlapped with a location of the ground plane portion in a vertical projection.

According to some embodiments, a package structure includes at least one die, an antenna element, and a through interlayer via wall. The antenna element is located above the at least one die. The through interlayer via wall is located between the antenna element and the at least one die, wherein the through interlayer via wall is connected to the antenna element, an air cavity is located between the antenna element and the at least one die and surrounded by the through interlayer via wall, and the antenna element is electrically connected to the at least one die.

According to some embodiments, a manufacturing method of a package structure is provided with the following steps, forming a first redistribution layer on a first carrier; forming at least one through interlayer via on the first carrier, wherein the at least one through interlayer via is electrically connected to the first redistribution layer; encapsulating the at least one through interlayer via in a molding compound; disposing at least one die on the first carrier, wherein the at least one die is electrically connected to the first redistribution layer; forming an antenna element, wherein the antenna element is at least partially in contact with the molding compound and electrically connected to the first redistribution layer, and the antenna element is overlapped with the at least one die in a vertical projection on the first redistribution layer; and disposing conductive elements on the first redistribution layer, wherein the first redistribution layer is located between the molding compound and the conductive elements.

According to some embodiments, a package structure include a ground plate, a semiconductor die, a molding compound, and an antenna element. The semiconductor die is located over the ground plate. The molding compound is located over the semiconductor die. The antenna element is located in the molding compound and overlaps with the ground plate along a stacking direction of the ground plate, the semiconductor die and the molding compound. The antenna element has a first side levelled with a first surface of the molding compound, and the ground plate is located between the semiconductor die and the antenna element.

According to some embodiments, a package structure include a first redistribution layer, at least one die, a through interlayer via wall, a cap layer, a molding compound, a cavity within the first portion of the molding compound, and an antenna element. The first redistribution layer has a first surface and a second surface opposite to the first surface. The at least one die is located over the second surface of the first redistribution layer. The through interlayer via wall is located over the first surface of the first redistribution layer. The a cap layer is located over the through interlayer via wall, wherein the through interlayer via wall is located between the first redistribution layer and the cap layer. The molding compound has a first portion and a second portion underlying thereto, wherein the at least one die is molded in the second portion of the molding compound, and the through interlayer via wall is molded in the first portion of the molding compound. The cavity is within the first portion of the molding compound and surrounded by the cap layer, the first redistribution layer and the through interlayer via wall. The antenna element is at least partially located in the cavity.

According to some embodiments, a method of manufacturing a package structure is provided with the following steps, forming a first redistribution layer; forming a through interlayer via wall on a first surface of the first redistribution layer; partially covering the first redistribution layer and the through interlayer via wall by a first molding compound; forming a cap layer with an antenna element disposed thereon over the first redistribution layer and on the through interlayer via wall and the first molding compound to form a cavity surrounding by the first redistribution layer, the through interlayer via wall and the cap layer, wherein the antenna element is at least partially located in the cavity; disposing at least one die on a second surface of the first redistribution layer, the first surface being opposite to the second surface; and laterally molding the at least one die in a second molding compound.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package structure, comprising:
a ground plate;
a semiconductor die, located on the ground plate;
a molding compound, encapsulating the semiconductor die and the ground plate; and
an antenna element, located in the molding compound and overlapping with the ground plate, wherein the antenna element has a first side, a second side and a third side connecting the first side and the second side, and a portion of the second side and a portion of the third side overlapped with the ground plate are exposed by a cavity located in the molding compound,
wherein the ground plate is located between the semiconductor die and the antenna element along a stacking direction of the ground plate and the semiconductor die.

2. The package structure of claim 1, wherein the molding compound comprises a first portion and a second portion underlying the first portion along the stacking direction, wherein:
the semiconductor die is in the second portion;
the antenna element is in the first portion; and
the ground plate is located between the first portion and the second portion.

3. The package structure of claim 2, wherein the cavity is located in the first portion of the molding compound.

4. The package structure of claim 2, further comprising:
a first redistribution circuit structure, located on and electrically connected to the semiconductor die, wherein the ground plate is a part of the first redistribution circuit structure, and the first redistribution circuit structure is located between the first portion and the second portion; and
a second redistribution circuit structure, located on and electrically connected to the semiconductor die, wherein the second portion is located between the first redistribution circuit structure and the second redistribution circuit structure.

5. The package structure of claim 4, further comprising:
conductive elements, located on the second redistribution circuit structure and electrically connected to the semiconductor die, wherein the second redistribution circuit structure is located between the conductive elements and the semiconductor die.

6. The package structure of claim 5, further comprising:
through vias, located between and electrically connecting the first redistribution circuit structure and the second redistribution circuit structure, and the through vias being located in the second portion of the molding compound; and
a through via wall, located between and electrically connecting the antenna element and the first redistribution circuit structure, and the through via wall being located in the first portion of the molding compound,
wherein an outer surface of the through via wall is covered by the first portion, and an inner surface of the through via wall is exposed by the first portion, wherein the outer surface is opposite to the inner surface, and the cavity is confined with the antenna element, the inner surface of the through via wall and the first redistribution circuit structure.

7. The package structure of claim 6, wherein surfaces of the through vias are substantially coplanar with a surface of the semiconductor die and a first surface of the second portion, and the first surface of the second portion is facing away from the first portion.

8. The package structure of claim 1, further comprising:
a cap layer, located on the molding compound and in contact with the first side of the antenna element; and
a metallic ring structure, located on the cap layer, wherein the cap layer is sandwiched between the antenna element and the metallic ring structure, and a shape of the metallic ring structure corresponds to a shape of the through interlayer via wall.

9. The package structure of claim 1, wherein the cavity is an air cavity.

10. A package structure, comprising:
a first redistribution layer having a first surface and a second surface opposite to the first surface;
a through interlayer via wall, having a frame shape and located on the first surface of the first redistribution layer;
a semiconductor die, located on the second surface of the first redistribution layer;
a first molding compound, molding the through interlayer via wall;
a second molding compound, molding the semiconductor die; and
an antenna element, located on the through interlayer via wall, wherein the through interlayer via wall is located between and electrically connected to the antenna element and the first redistribution layer, and a surface of the antenna element facing the first surface of the first redistribution layer and surrounded by the through interlayer via wall is free of the first molding compound.

11. The package structure of claim 10, wherein a cavity is located in the first molding compound and between the antenna element and the first redistribution layer, and the cavity is an air cavity.

12. The package structure of claim 11, wherein the surface of the antenna element facing the first surface of the first redistribution layer being free from the first molding compound is exposed by the air cavity.

13. The package structure of claim 10, wherein the through interlayer via wall is in a form of a closed frame or a frame with slits.

14. The package structure of claim 13, further comprising:
a cap layer, located on the first molding compound and in contact with the antenna element; and
a metallic ring structure, located on the cap layer, wherein the cap layer is sandwiched between the antenna element and the metallic ring structure, and a shape of the metallic ring structure corresponds to a shape of the through interlayer via wall.

15. The package structure of claim 13, wherein the metallic ring structure is in a form of a closed frame.

16. The package structure of claim 10, further comprising:
a second redistribution layer, located under the second molding compound and the semiconductor die;
through vias, located adjacent to the semiconductor die and penetrating the second molding compound, wherein the through vias are electrically connected to the first redistribution layer and the second redistribution layer; and
conductive elements, located on the second redistribution layer, wherein the second redistribution layer is located between the through vias and the conductive elements.

17. A method of manufacturing a package structure, comprising:
disposing an antenna element over a carrier;
forming a through via on the antenna element, the through via being electrically connected to the antenna element;
encapsulating the antenna element and the through via in a molding compound, a surface of the through via being substantially coplanar with a surface of the molding compound;
forming a redistribution circuit layer having a ground plate over the molding compound, the ground plate being overlapped with the antenna element, and the redistribution circuit layer being electrically connected to the through via;
mounting a semiconductor die on a side of the redistribution circuit layer, the ground plate being overlapped with the semiconductor die and located between the semiconductor die and the antenna element; and
disposing conductive connectors on the side of the redistribution circuit layer, the conductive connectors being electrically connected to the semiconductor die through the redistribution circuit layer.

18. The method of claim 17, prior to disposing the conductive connectors on the side of the redistribution circuit layer, further comprising:
forming under-ball metallurgy (UBM) patterns on the side of the redistribution circuit layer for electrically connecting the redistribution circuit layer and the conductive connectors.

19. The method of claim 17, wherein forming the through via on the antenna element comprises forming the through via near an edge of the antenna element, the through via being in contact with the antenna element.

20. The method of claim 17, wherein encapsulating the antenna element and the through via in the molding compound comprises:
over-molding the antenna element and the through via in the molding compound; and
planarizing the molding compound to accessibly reveal the surface of the through via.

* * * * *